(12) United States Patent
Joei

(10) Patent No.: US 9,793,324 B2
(45) Date of Patent: Oct. 17, 2017

(54) SOLID-STATE IMAGE-PICKUP DEVICE, METHOD OF MANUFACTURING THE SAME, AND ELECTRONIC APPARATUS

(71) Applicant: SONY CORPORATION, Tokyo (JP)

(72) Inventor: Masahiro Joei, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/900,259

(22) PCT Filed: Jun. 25, 2014

(86) PCT No.: PCT/JP2014/003406
§ 371 (c)(1),
(2) Date: Dec. 21, 2015

(87) PCT Pub. No.: WO2015/001771
PCT Pub. Date: Jan. 8, 2015

(65) Prior Publication Data
US 2016/0372520 A1   Dec. 22, 2016

(30) Foreign Application Priority Data
Jul. 4, 2013   (JP) .................................. 2013-140398

(51) Int. Cl.
*H01L 27/30*   (2006.01)
*H01L 51/44*   (2006.01)

(52) U.S. Cl.
CPC .......... *H01L 27/307* (2013.01); *H01L 27/302* (2013.01); *H01L 51/448* (2013.01); *Y02E 10/549* (2013.01); *Y02P 70/521* (2015.11)

(58) Field of Classification Search
CPC ... H01L 27/302; H01L 27/307; H01L 51/448; Y02E 10/549; Y02P 70/521
See application file for complete search history.

(56) References Cited

U.S. PATENT DOCUMENTS

| 2006/0196533 A1 | 9/2006 | Maehara | |
|---|---|---|---|
| 2013/0139887 A1* | 6/2013 | Stathatos | H01G 9/2018 136/263 |
| 2013/0193308 A1* | 8/2013 | Cellek | H01L 31/1013 250/208.1 |
| 2016/0197122 A1* | 7/2016 | Ryuichi | H01L 27/307 257/40 |

FOREIGN PATENT DOCUMENTS

| JP | 2006-245045 | 9/2006 |
|---|---|---|
| JP | 2007-012796 | 1/2007 |
| JP | 2012 160619 A | 8/2012 |

OTHER PUBLICATIONS

International Search Report prepared by the European Patent Office on Sep. 26, 2014, for International Application No. PCT/JP2014/003406.

* cited by examiner

*Primary Examiner* — Allan R Wilson
(74) *Attorney, Agent, or Firm* — Sheridan Ross P.C.

(57) ABSTRACT

Solid-state image-pickup devices (10), including: at least one first photoelectric conversion section (11B, 11R) disposed in a substrate (11); a second photoelectric conversion section (11G) disposed over the substrate and including an organic photoelectric conversion layer (16); and an ultraviolet protective film (18) that covers a light incident surface of the organic photoelectric conversion layer, and methods of producing the same.

10 Claims, 14 Drawing Sheets

[Fig. 1]
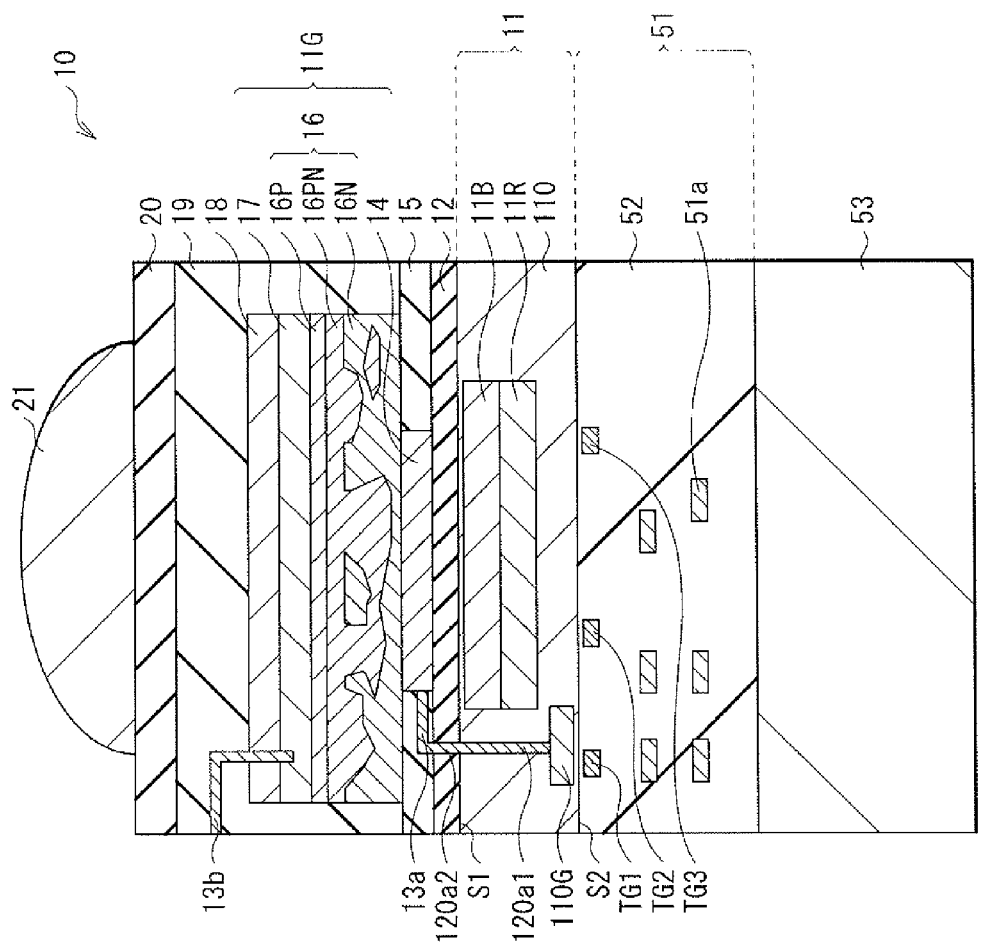

[Fig. 2A]
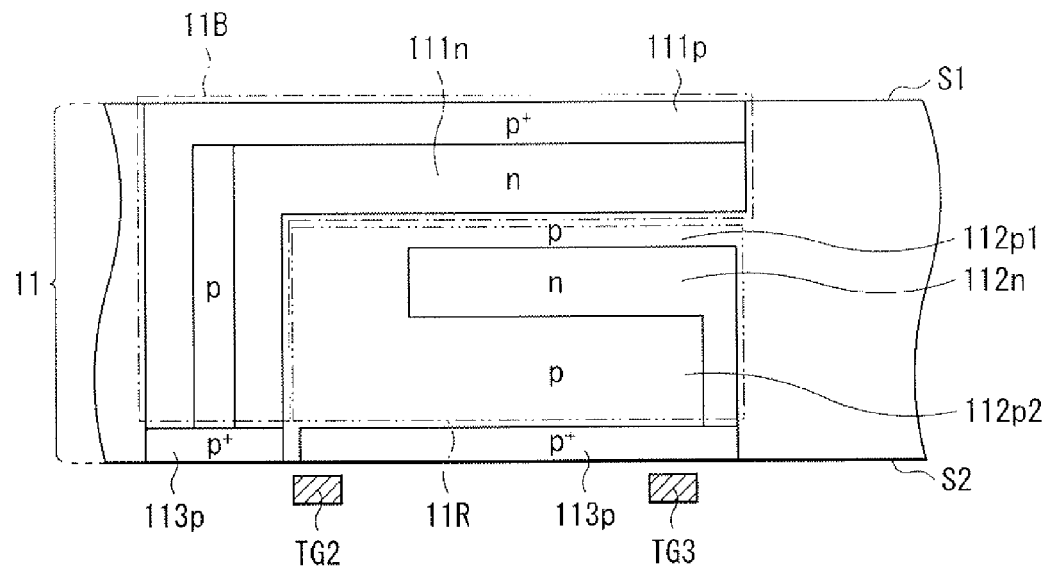
[Fig. 2B]
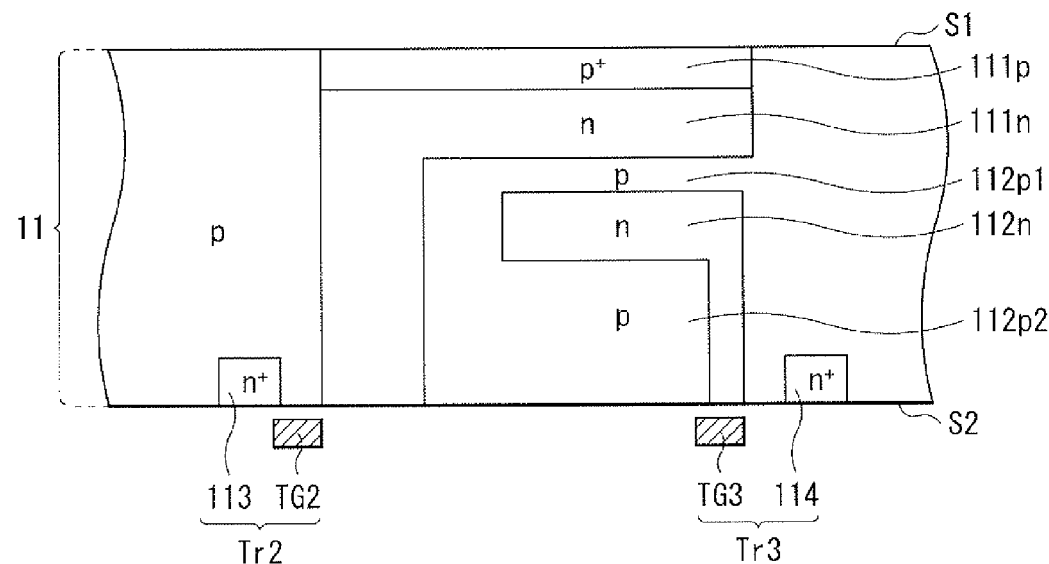

[Fig. 3]
DRAWING FROM LOWER SIDE (ELECTRONS)
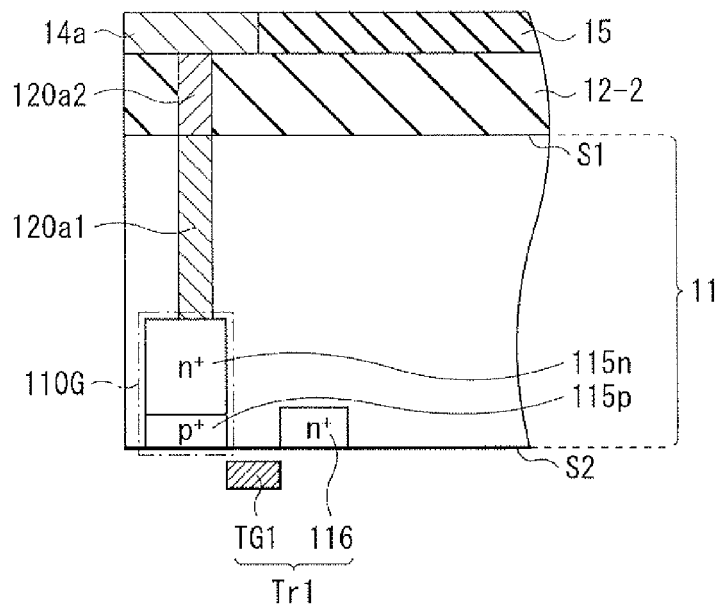
[Fig. 4]
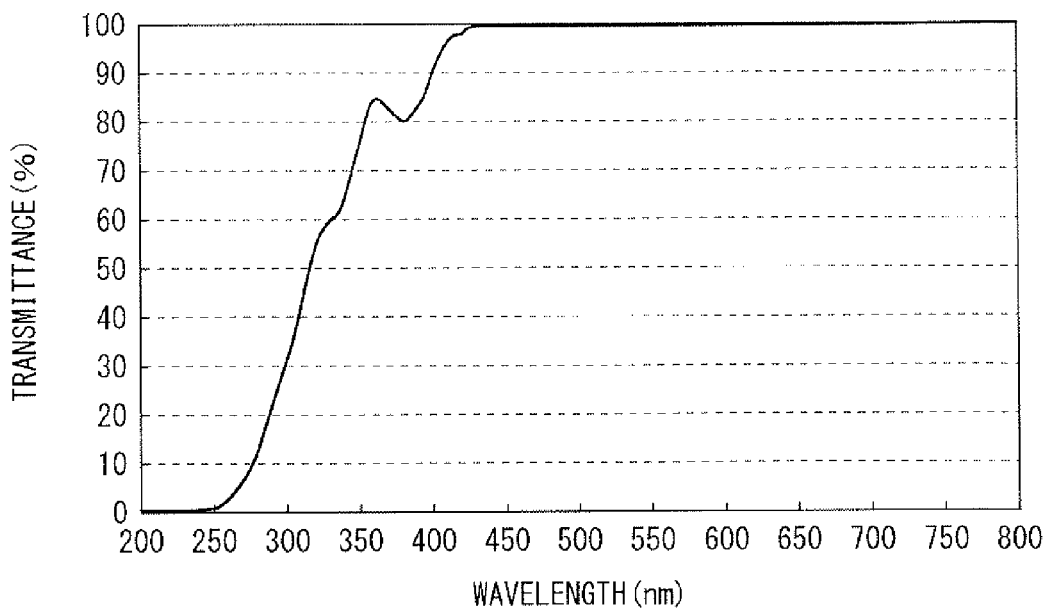

[Fig. 5]
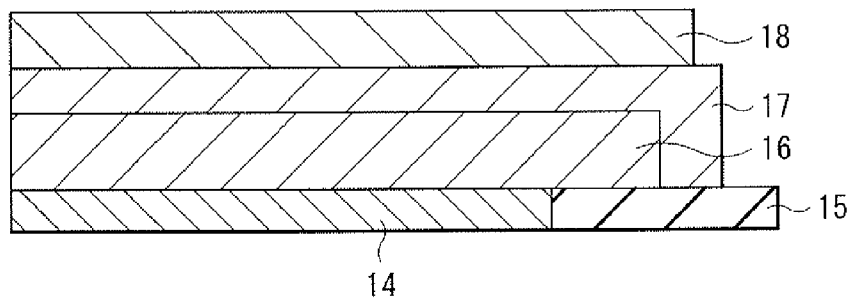
[Fig. 6A]
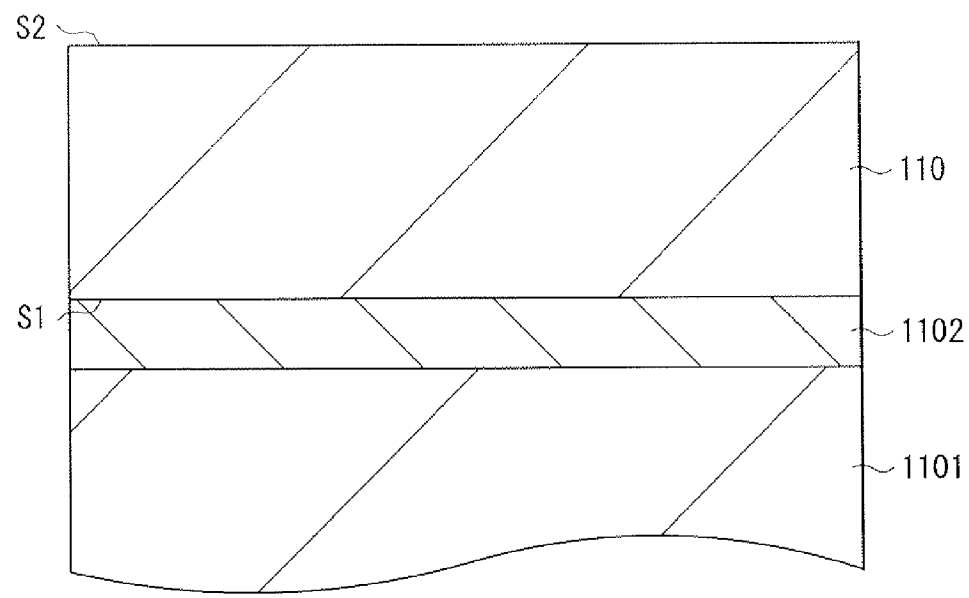
[Fig. 6B]
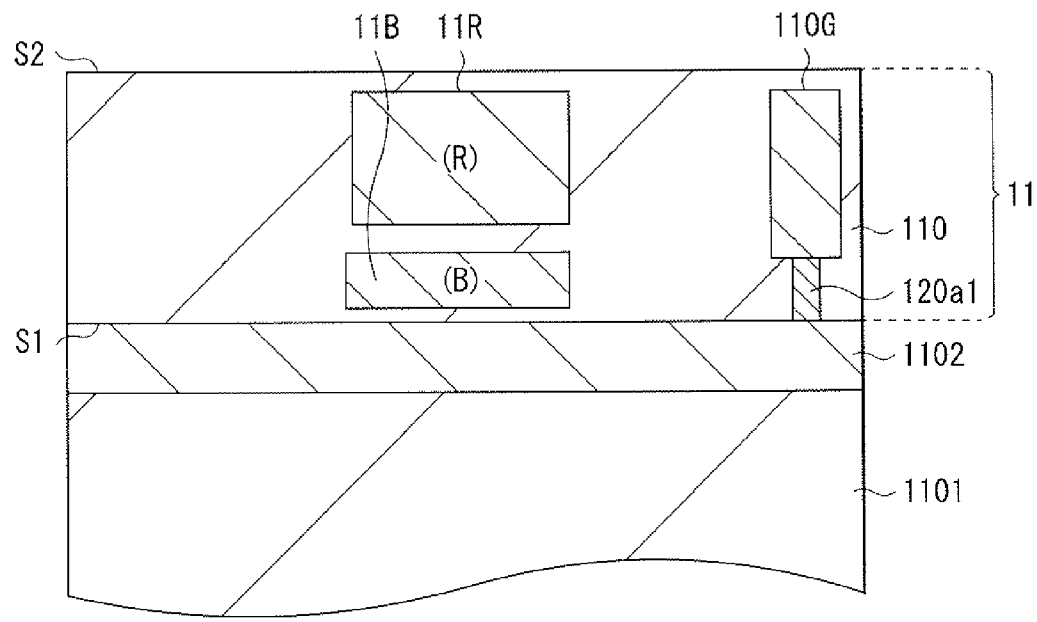

[Fig. 7]
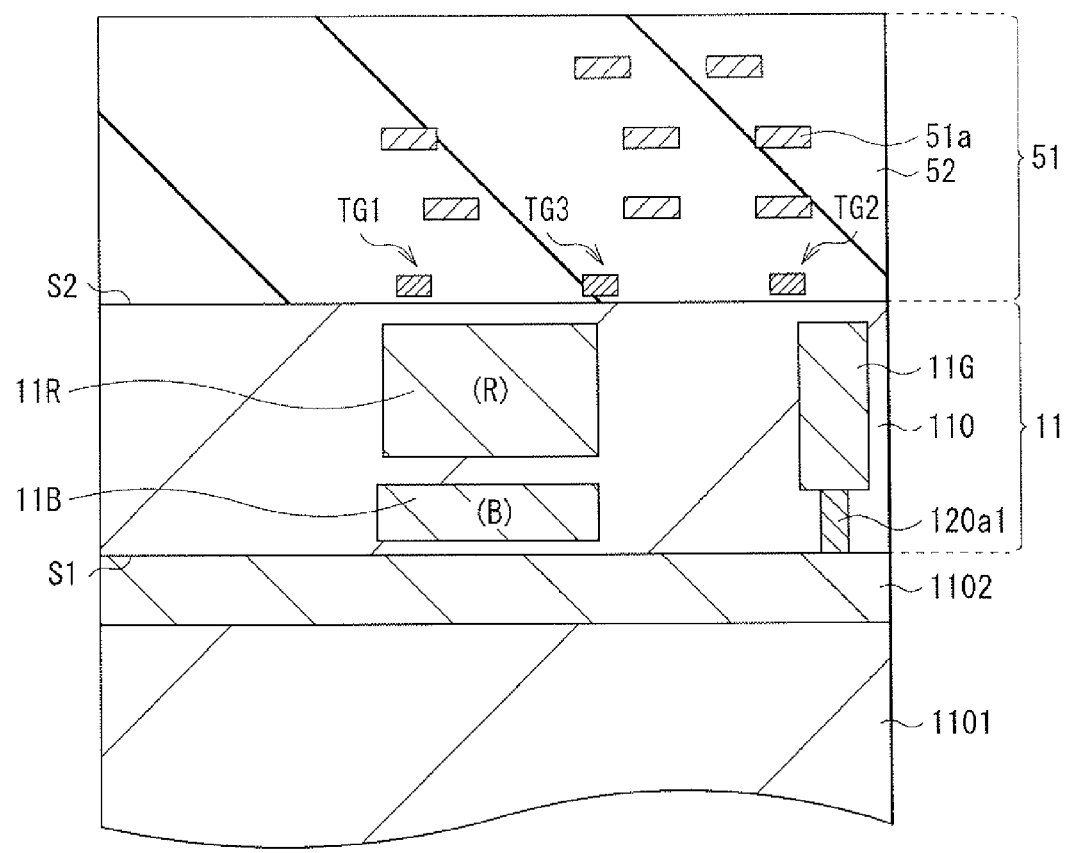

[Fig. 8]
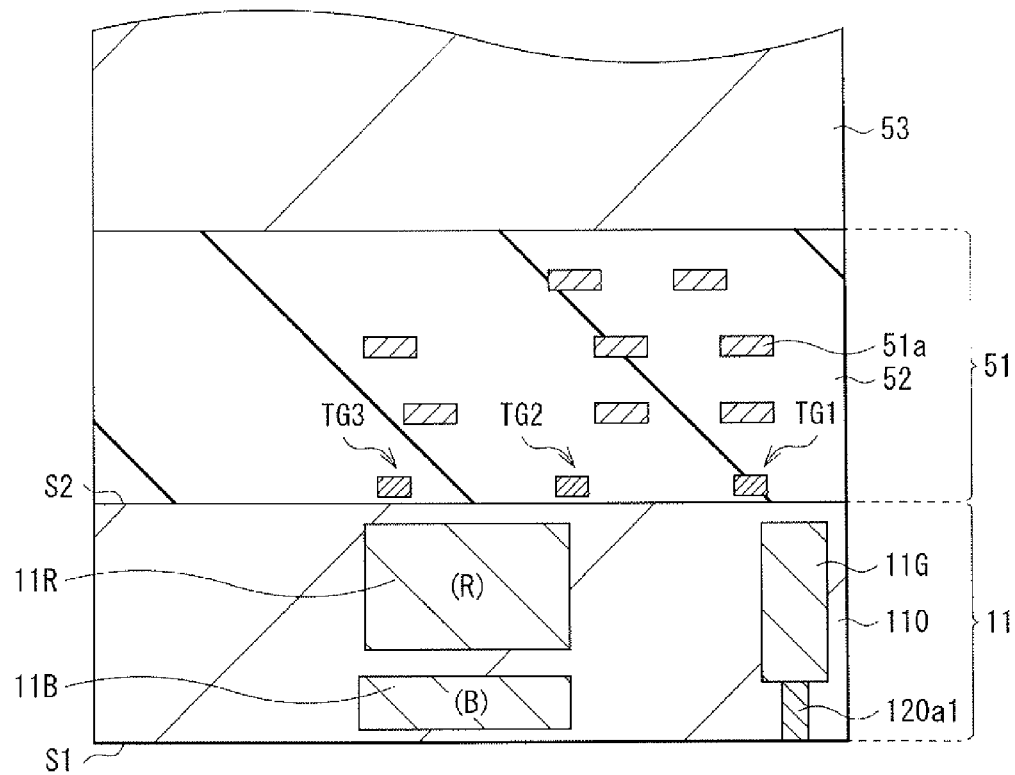
[Fig. 9]
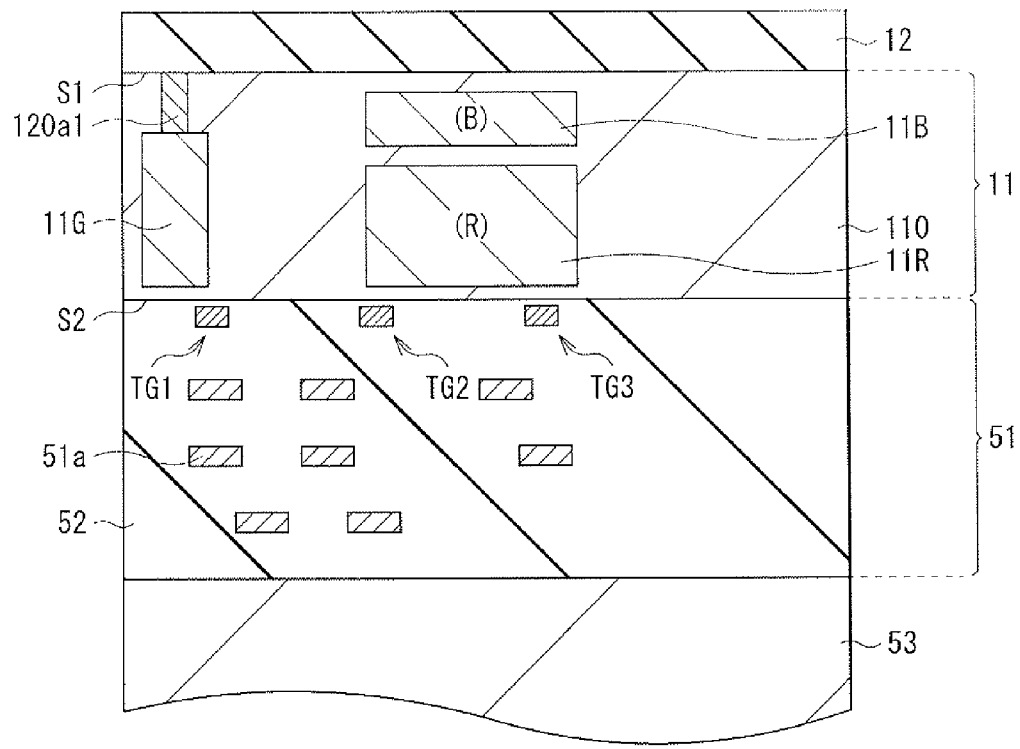

[Fig. 10A]
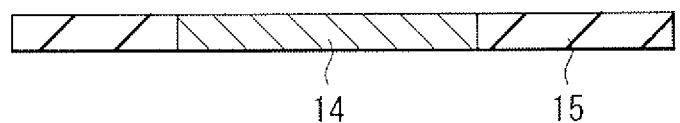
[Fig. 10B]
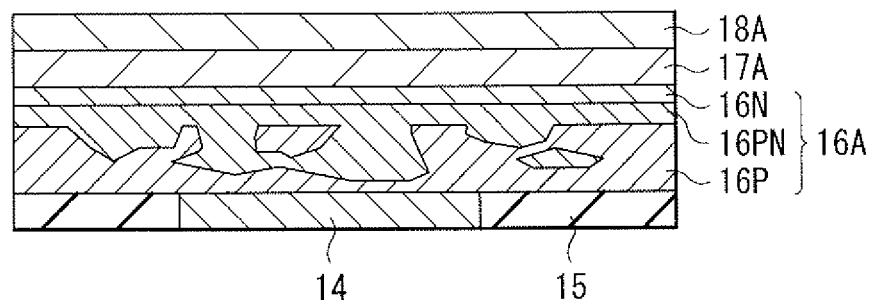
[Fig. 10C]
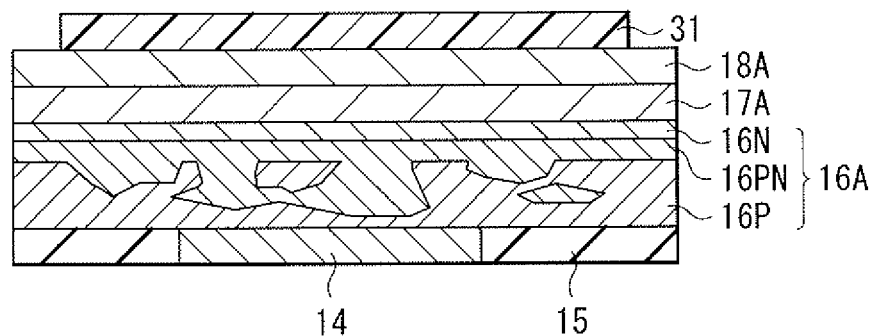
[Fig. 10D]
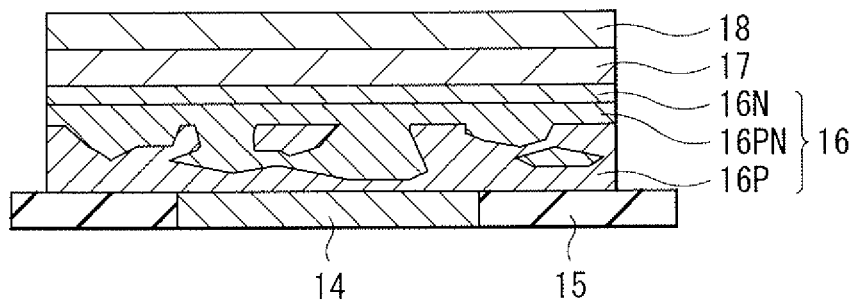

[Fig. 11]
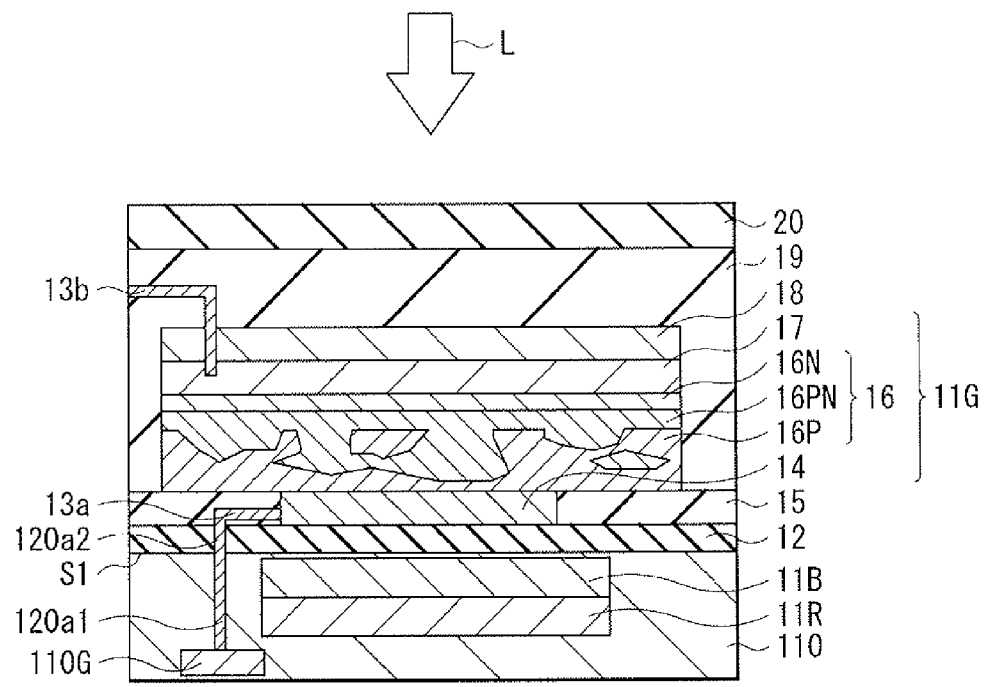
[Fig. 12]
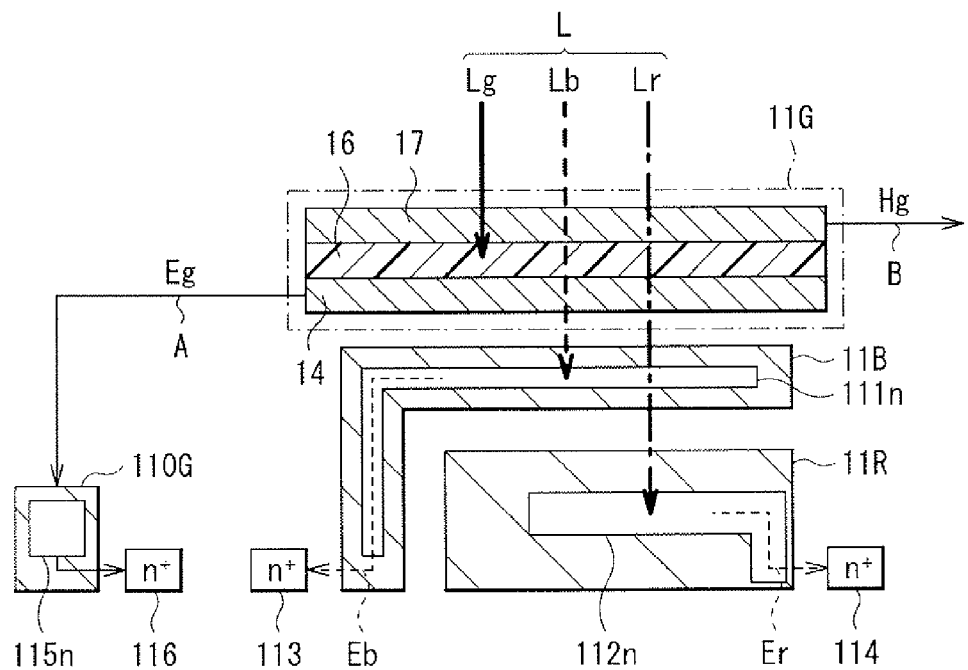

[Fig. 13A]
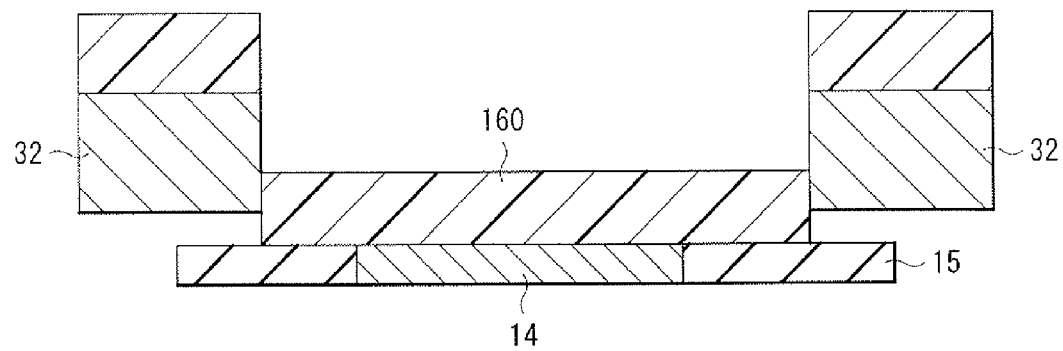
[Fig. 13B]
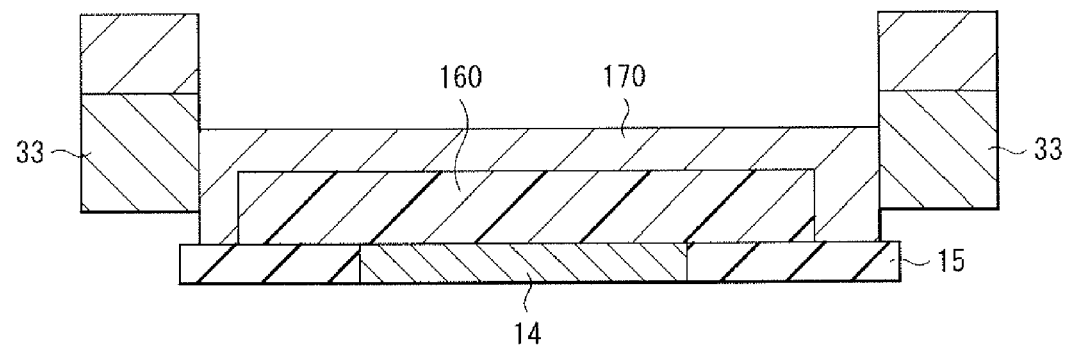

[Fig. 14]
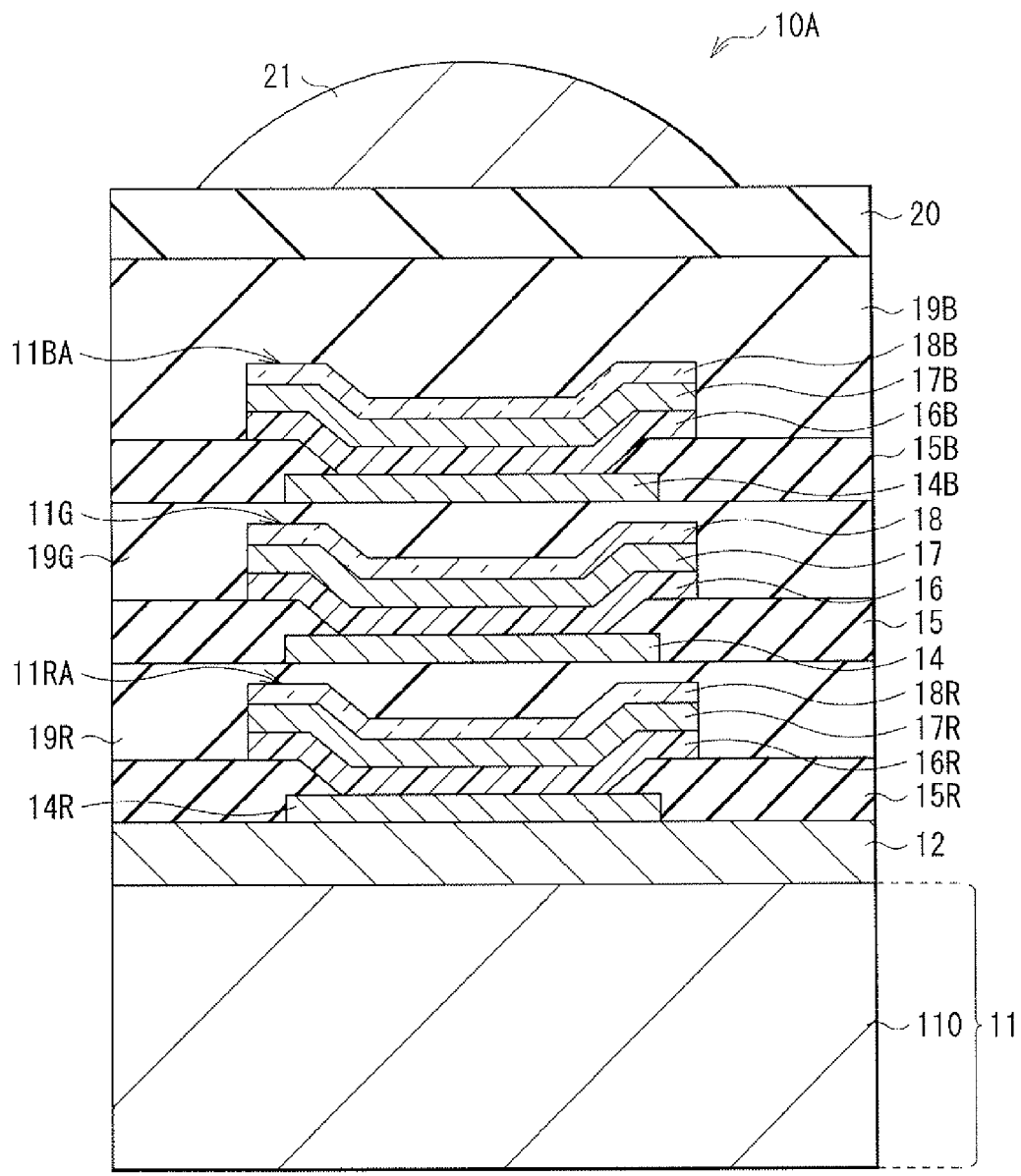

[Fig. 15]
DRAWING FROM LOWER SIDE (HOLES)
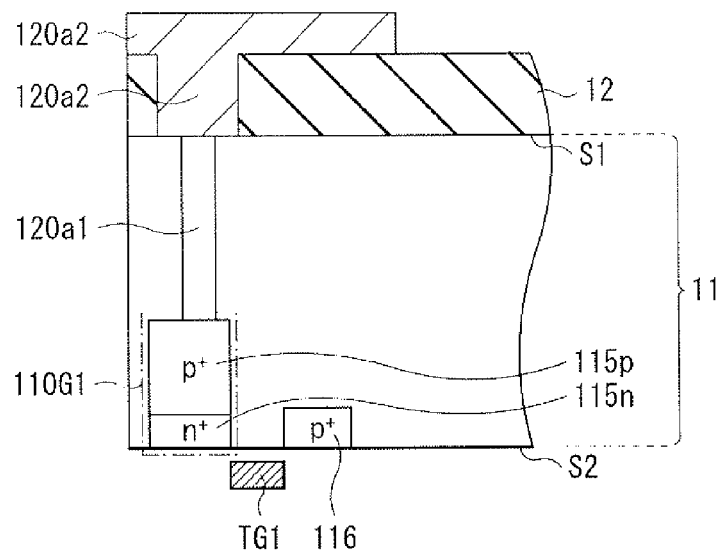
[Fig. 16]
DRAWING FROM UPPER SIDE (ELECTRONS/HOLES)
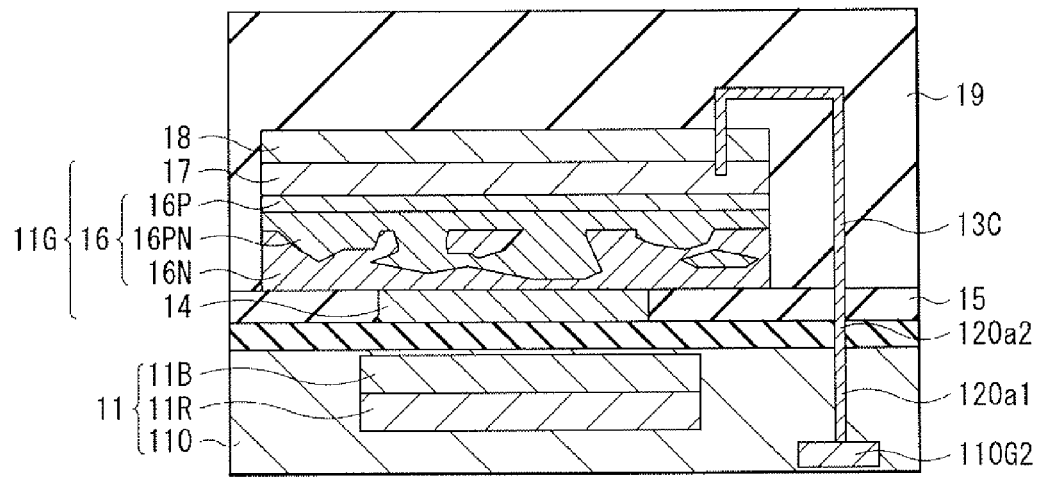

[Fig. 17]
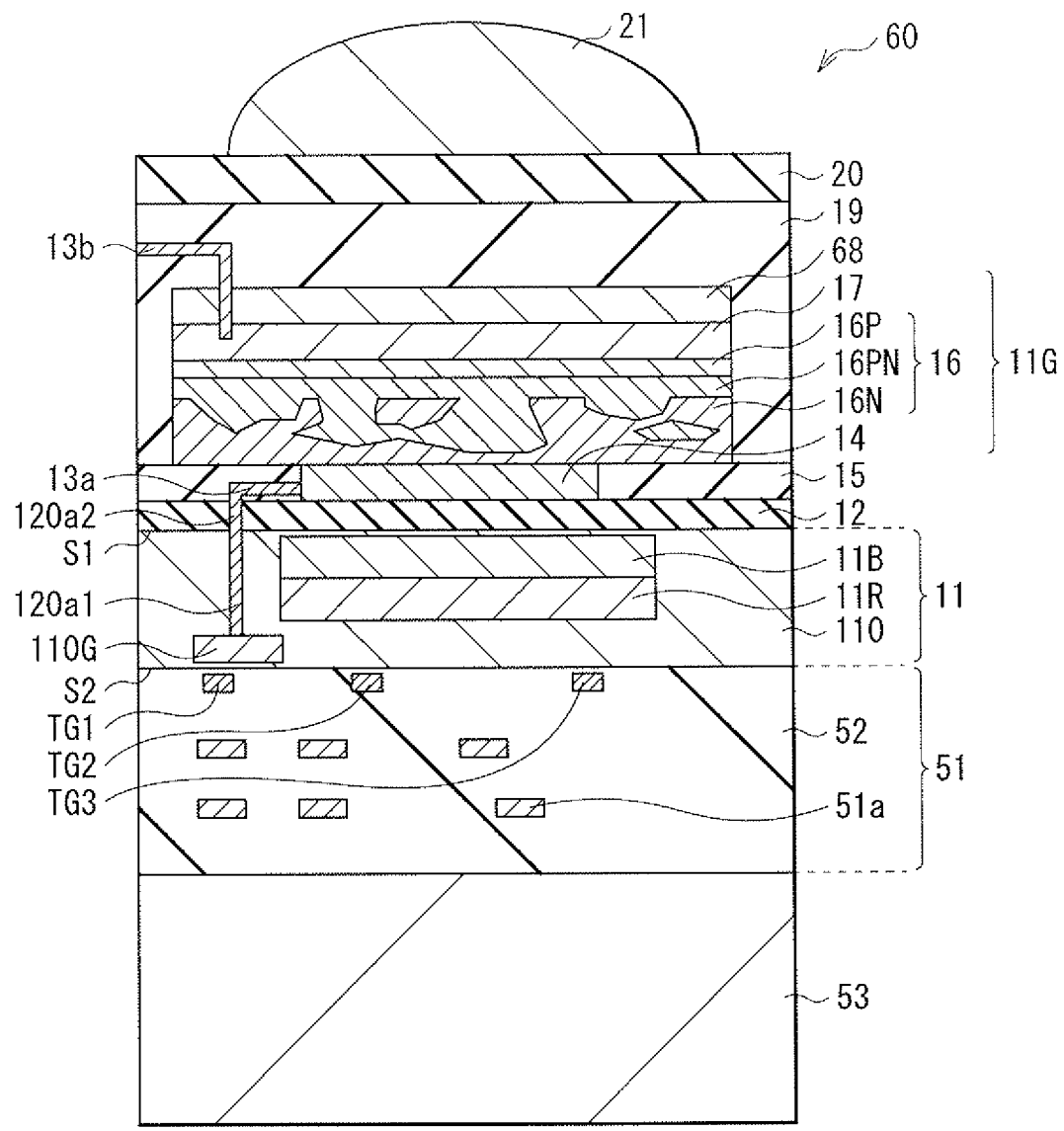

[Fig. 18]
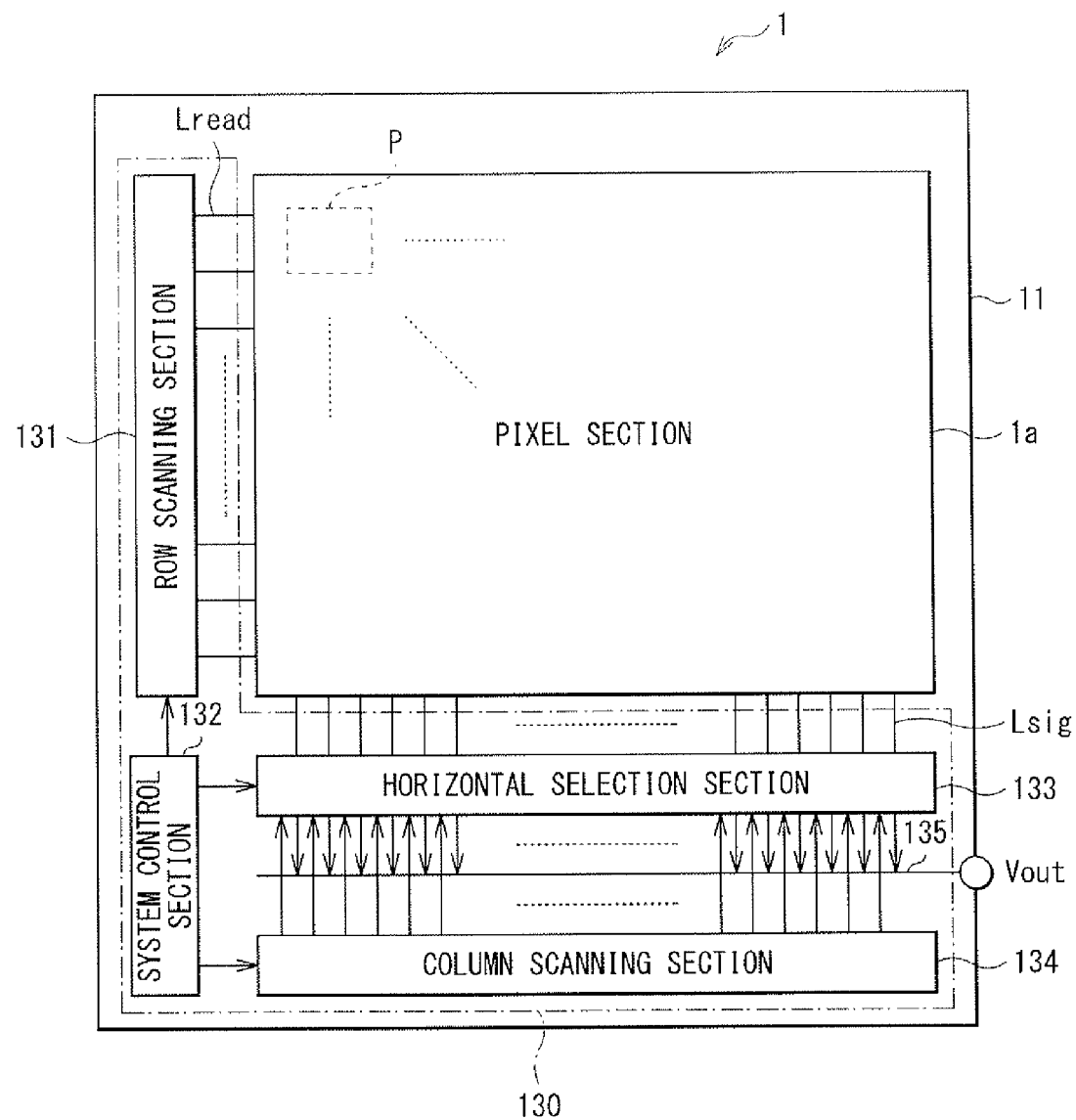

[Fig. 19]
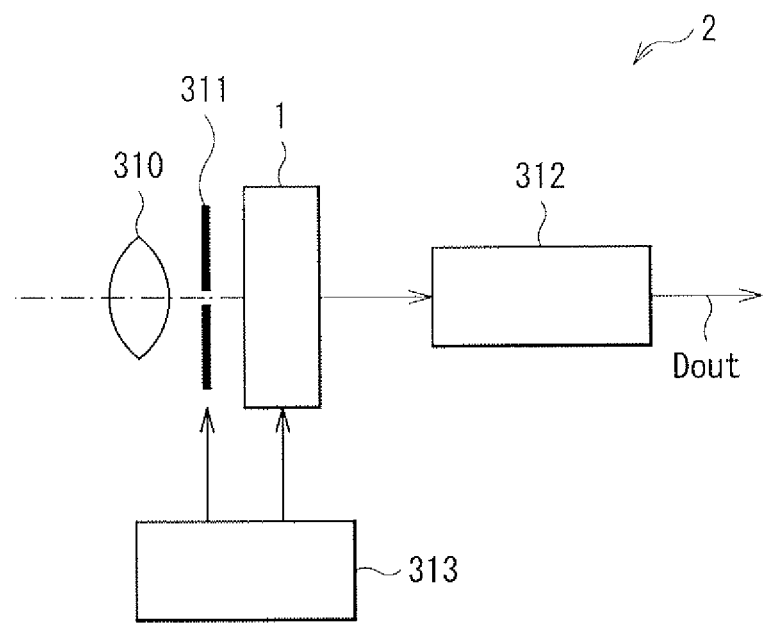

SOLID-STATE IMAGE-PICKUP DEVICE, METHOD OF MANUFACTURING THE SAME, AND ELECTRONIC APPARATUS

CROSS REFERENCE TO RELATED APPLICATIONS

This application is a national stage application under 35 U.S.C. 371 and claims the benefit of PCT Application No. PCT/JP2014/003406 having an international filing date of Jun. 25, 2014, which designed the United States, which PCT application claimed the benefit of Japanese Priority Patent Application JP 2013-140398 filed Jul. 4, 2013, the disclosures of which are incorporated herein by reference in their entirety.

TECHNICAL FIELD

The present technology relates to a solid-state image-pickup device, including a plurality of photoelectric conversion sections that absorb light of different wavelengths, and a method of manufacturing the same, and an electronic apparatus including the solid-state image-pickup device.

BACKGROUND ART

In solid-state image pickup units, such as CCD (Charge Coupled Device) image sensors and CMOS (Complementary Metal Oxide Semiconductor) image sensors, the number of photons incident on a unit pixel (a solid-state image-pickup device) is reduced with reduction in pixel size, thereby causing reduction in an S/N ratio. As represented by, for example, a Bayer pattern, pixels are divided into red, green, and blue pixels by a color filter, and are arranged on a same plane. In this method, for example, light of green and blue wavelengths do not pass through a red pixel (color filter); therefore, light loss is caused, and sensitivity is reduced accordingly. Moreover, since a color signal is produced by performing an interpolation processing between red, green, and blue pixels, a false color may be generated.

Therefore, there is proposed a method of obtaining three color photoelectric conversion signals using one pixel by laminating three photoelectric conversion sections. For example, one (for example, a photoelectric conversion section corresponding to green light) of the three photoelectric conversion sections is disposed on a silicon substrate, i.e., outside the silicon substrate, and the other two photoelectric conversion sections (for example, photoelectric conversion sections corresponding to red light and blue light) are disposed in an interior of the silicon substrate (for example, refer to PTL 1). The photoelectric conversion section disposed outside the silicon substrate includes a photoelectric conversion layer including an organic material, and the photoelectric conversion layer is disposed between a pair of electrodes. On the other hand, each of the photoelectric conversion sections in the interior of the silicon substrate is configured of a photodiode.

Moreover, there is proposed a method of arranging, on a substrate, all three photoelectric conversion sections, each of which includes a photoelectric conversion layer including an organic material (for example, refer to PTL 2). In this image pickup device, a TFT (Thin Film Transistor) for reading of a signal is provided for each of the photoelectric conversion sections.

CITATION LIST

Patent Literature

[PTL 1] Japanese Unexamined Patent Application Publication No. 2011-29337
[PTL 2] Japanese Unexamined Patent Application Publication No. 2012-160619

SUMMARY

Technical Problem

In recent years, it is desirable to accurately control the size of the above-described photoelectric conversion section, including an organic material, to downsize a pixel.

It is desirable to provide a solid-state image-pickup device capable of downsizing a pixel, a method of manufacturing the same, and an electronic apparatus including the solid-state image-pickup device.

Solution to Problem

According to an illustrative embodiment of the present technology, there is provided a solid-state image-pickup device including: at least one first photoelectric conversion section disposed in a substrate; a second photoelectric conversion section disposed over the substrate and including an organic photoelectric conversion layer; and an ultraviolet protective film that covers a light incident surface of the organic photoelectric conversion layer.

In the solid-state image-pickup device according to the embodiment of the present technology, the light incident surface of the organic layer is advantageously covered with the ultraviolet protective film. Therefore, for example, even if plasma irradiation is performed to form the organic layer, ultraviolet rays caused by the plasma irradiation are blocked before reaching the organic layer. Accordingly, even if the organic layer is patterned by dry etching, deterioration of the organic layer caused by ultraviolet rays is reduced.

According to an illustrative embodiment of the present technology, there is provided an electronic apparatus provided with a solid-state image-pickup device, the solid-state image-pickup device including: at least one first photoelectric conversion section disposed in a substrate; a second photoelectric conversion section disposed over the substrate and including an organic photoelectric conversion layer; and an ultraviolet protective film covering a light incident surface of the organic photoelectric conversion layer such that light enters the ultraviolet protective film before the light enters the organic photoelectric conversion layer.

According to an illustrative embodiment of the present technology, there is provided a method of manufacturing a solid-state image-pickup device, the method including: forming at least one or more first photoelectric conversion sections in a substrate; forming an organic photoelectric conversion layer above the substrate; forming an ultraviolet protective film to cover a light incident surface of the organic photoelectric conversion layer; and patterning the organic photoelectric conversion layer to form a second photoelectric conversion section.

Advantageous Effects of Invention

In the solid-state image-pickup device, the method of manufacturing the solid-state image-pickup device, and the electronic apparatus according to the embodiments of the present technology, the ultraviolet protective film is provided as described herein, and thus, when the organic layer is patterned, a method enabling microfabrication, for example, dry etching, may be used. Therefore, downsizing of a pixel is advantageously achievable. As used herein, an ultraviolet protective film may also be referred to as an ultraviolet protection film and/or an ultraviolet absorption film.

It is to be understood that both the foregoing general description and the following detailed description are exemplary and illustrative, and are intended to provide further explanation of the technology as claimed.

BRIEF DESCRIPTION OF DRAWINGS

FIG. 1 is an illustrative sectional view showing a schematic configuration of an image pickup device according to a first embodiment of the present technology.

FIG. 2A is an illustrative sectional view showing a configuration example of an inorganic photoelectric conversion section shown in FIG. 1.

FIG. 2B is an illustrative diagram showing a section different from a section shown in FIG. 2A of the inorganic photoelectric conversion section.

FIG. 3 is an illustrative sectional view for describing a configuration of a green storage layer shown in FIG. 1.

FIG. 4 is an illustrative diagram showing an example of an absorption property of an ultraviolet absorption film shown in FIG. 1.

FIG. 5 is an illustrative sectional view showing an end of an organic photoelectric conversion section shown in FIG. 1.

FIG. 6A is an illustrative sectional view showing an example of a process of manufacturing the illustrative image pickup device shown in FIG. 1.

FIG. 6B is an illustrative sectional view showing a process following FIG. 6A.

FIG. 7 is an illustrative sectional view showing a process following FIG. 6B.

FIG. 8 is an illustrative sectional view showing a process following FIG. 7.

FIG. 9 is an illustrative sectional view showing a process following FIG. 8.

FIG. 10A is an illustrative sectional view showing a process following FIG. 9.

FIG. 10B is an illustrative sectional view showing a process following FIG. 10A.

FIG. 10C is an illustrative sectional view showing a process following FIG. 10B.

FIG. 10D is an illustrative sectional view showing a process following FIG. 10C.

FIG. 11 is an illustrative sectional view for describing an operation of the image pickup device shown in FIG. 1.

FIG. 12 is an illustrative schematic view for describing the operation of the image pickup device shown in FIG. 1.

FIG. 13A is an illustrative sectional view showing a process of manufacturing an image pickup device according to a comparative example.

FIG. 13B is an illustrative sectional view showing a process following FIG. 13A.

FIG. 14 is an illustrative sectional view showing a configuration of an image pickup device according to Modification Example 1.

FIG. 15 is an illustrative sectional view showing a configuration of an image pickup device according to Modification Example 2.

FIG. 16 is an illustrative sectional view showing a configuration of an image pickup device according to Modification Example 3.

FIG. 17 is an illustrative sectional view showing a configuration of an image pickup device according to a second embodiment of the present technology.

FIG. 18 is an illustrative schematic view showing an entire configuration of an image pickup unit using the image pickup device illustrated in FIG. 1.

FIG. 19 is an illustrative diagram showing a schematic configuration of an electronic apparatus to which the image pickup unit illustrated in FIG. 18 is applied.

DESCRIPTION OF ILLUSTRATIVE EMBODIMENTS

Some embodiments of the present technology will be described in detail below referring to the accompanying drawings. It is to be noted that the description will be given in the following order.

1. First Embodiment (Image pickup device: Example in which an organic photoelectric conversion film is covered with an ultraviolet absorption film)
2. Modification Example 1 (Example including a plurality of organic photoelectric conversion sections)
3. Modification Example 2 (Example in which holes are drawn as signal charges from a lower electrode)
4. Modification Example 3 (Example in which electrons or holes are drawn as signal charges from an upper electrode)
5. Second Embodiment (Image pickup device: Example in which an organic photoelectric conversion film is covered with an ultraviolet reflective film)
6. Application Examples (Image pickup unit)

(First Embodiment)
(Configuration of Image Pickup Device 10)

FIG. 1 shows an illustrative sectional configuration of a solid-state image pickup device (an image pickup device 10) according to an embodiment of the present technology. The image pickup device 10 configures one pixel (for example, a pixel P in FIG. 18 that will be described later) in an image pickup unit (for example, an image pickup unit 1 in FIG. 18 that will be described later), such as a CCD image sensor or a CMOS image sensor. The image pickup device 10 is a so-called back-illuminated type image pickup device, and includes a multilayer wiring layer 51 on a surface (a surface S2) opposed to a light reception surface (a surface S1) of a semiconductor substrate 11.

The image pickup device 10 includes inorganic photoelectric conversion sections 11B and 11R (first photoelectric conversion sections), and an organic photoelectric conversion section 11G (a second photoelectric conversion section) that face each other and are laminated along a vertical direction (an optical path). The inorganic photoelectric conversion sections 11B and 11R are disposed in an interior of the semiconductor substrate 11, and the organic photoelectric conversion section 11G is disposed on the surface S1 of the semiconductor substrate 11. In other words, in the image pickup device 10, light first enters the organic photoelectric conversion section 11G of the inorganic photoelectric conversion sections 11B and 11R and the organic photoelectric conversion section 11G. The organic photoelectric conversion section 11G includes an organic photoelectric conversion layer 16 (an organic layer) between a pair of electrodes (an upper electrode 17 and a lower electrode 14), and light enters the organic photoelectric conversion layer 16 from the upper electrode 17. Such an organic photoelectric conversion section 11G and the inorganic photoelectric conversion sections 11B and 11R selectively detect light of different wavelengths to perform photoelectric conversion; therefore, a plurality of color signals are obtained in one image pickup device 10, without providing a color filter. The inorganic photoelectric conversion section 11R, the inorganic photoelectric conversion section 11B, and the organic photoelectric conversion section 11G may obtain a color signal of red (for example, a wavelength of approximately 620 nm to approximately 750 nm), a color signal of blue (for example, a wavelength of approximately 450 nm to approximately 495 nm) and a color signal of green (for example, a wavelength of approximately 495 nm to approximately 570 nm), respectively.

For example, a p-type semiconductor well region (not shown) is provided in proximity to the surface S2 of the semiconductor substrate 11. A plurality of pixel transistors (transfer transistors Tr1, Tr2, and Tr3) corresponding to the organic photoelectric conversion section 11G and the inorganic photoelectric conversion sections 11B and 11R, respectively, are also provided in proximity to the surface S2 of the semiconductor substrate 11. The transfer transistors Tr1, Tr2, and Tr3, include gate electrodes TG1, TG2, and TG3, respectively. The transfer transistors Tr1, Tr2, and Tr3, are configured to transfer, to, for example, a vertical signal line Lsig (shown in FIG. 18 that will be described later). The signal charges may include, for example, a signal charge corresponding to green generated in the organic photoelectric conversion section 11G, a signal charge corresponding to blue generated in the inorganic photoelectric conversion section 11B, and a signal charge corresponding to red generated in the inorganic photoelectric conversion section 11R, respectively. Each of the signal charges may be an electron or a hole generated by photoelectric conversion; however, a case where an electron is read as a signal charge (a case where an n-type semiconductor region serves as a photoelectric conversion layer) will be described as an example below.

A reset transistor, an amplification transistor, a selection transistor, and the like are provided together with the above-described transfer transistors Tr1, Tr2, and Tr3, in proximity to the surface S2 of the semiconductor substrate 11. Such transistors may be, for example, MOSEETs (Metal Oxide Semiconductor Field Effect Transistors), and configure a circuit in each of the photoelectric conversion sections (each of the organic photoelectric conversion section 11G and the inorganic photoelectric conversion sections 11B and 11R). The circuit may have, for example, a three-transistor configuration including the transfer transistor, the reset transistor, and the amplification transistor, or a four-transistor configuration including the selection transistor in addition to the three-transistor configuration. The transistors other than the transfer transistor may be shared among the photoelectric conversion sections or pixels.

The semiconductor substrate 11 may be configured of, for example, an n-type silicon (Si) layer. Herein, a n-type and p-type silicon layer may also be referred to as a a n-type or p-type silicon semiconductor layer, a n-type or p-type semiconductor, and a n-type or p-type semiconductor region, among others. In the interior of the semiconductor substrate 11, a green storage layer 110G is provided together with the above-described inorganic photoelectric conversion sections 11B and 11R.

Each of the inorganic photoelectric conversion sections 11B and 11R is configured of a photodiode having a pn junction, and, for example, the inorganic photoelectric conversion section 11B and the inorganic photoelectric conversion section 11R may be disposed in this order from the surface S1 of the semiconductor substrate 11.

FIGS. 2A and 2B show specific configurations illustrative of the inorganic photoelectric conversion sections 11B and 11R. The inorganic photoelectric conversion section 11B includes a p-type semiconductor region (hereinafter simply referred to as "p-type region") 111p serving as a hole storage layer and an n-type photoelectric conversion layer (an n-type semiconductor region that is hereinafter simply referred to as "n-type region") 111n serving as an electron storage layer. In the diagrams, a superscript "+(plus)" placed at "p" or "n" indicates that the p-type or n-type impurity concentration is high. The p-type region 111p and the n-type photoelectric conversion layer 111n are disposed in a predetermined region in proximity to the surface S1 of the semiconductor substrate 11 along a direction horizontal to the surface S1, and each of the p-type region 111p and the n-type photoelectric conversion layer 111n is bent to allow at least a part thereof to extend in a direction perpendicular to the surface S1. A floating diffusion (a FD 113) of the transfer transistor Tr2 for blue is provided in proximity to the surface S2 of the semiconductor substrate 11 (refer to FIG. 2B), and the n-type photoelectric conversion layer 111n is connected to the FD 113 of the n-type region. A p-type region 113p (a hole storage layer) is provided between the p-type region 111p and the n-type photoelectric conversion layer 111n, and the surface S2 of the semiconductor substrate 11. The p-type region 111p is connected to a p-type semiconductor well region (not illustrated) in proximity to the surface S1 of the semiconductor substrate 11.

The inorganic photoelectric conversion section 11R may have a p-n-p laminate configuration along a thickness direction (a direction perpendicular to the surfaces S1 and S2) of the semiconductor substrate 11, and includes an n-type photoelectric conversion layer 112n (an electron storage layer) between a p-type region 112p1 and a p-type region 112p2 (a hole storage layer). The n-type photoelectric conversion layer 112n is bent to allow at least a part thereof to extend along the direction perpendicular to the surface S1 of the semiconductor substrate 11. A floating diffusion (a FD 114) of the transfer transistor Tr3 for red is provided in proximity to the surface S2 of the semiconductor substrate 11, and the n-type photoelectric conversion layer 112n is connected to the FD 114 of the n-type region.

FIG. 3 shows an illustrative configuration of the green storage layer 110G. The green storage layer 110G includes an n-type region 115n serving as an electron storage layer, and the n-type region 115n is connected to a conductive plug 120a1. The conductive plug 120a1 is embedded in the semiconductor substrate 11, and functions as a signal-charge (electron) transmission path between the organic photoelectric conversion section 11G and the green storage layer 110G. In other words, electrons transmitted from the lower electrode 14 through the conductive plug 120a1 are stored in the green storage layer 110G. A floating diffusion (a FD 116) of the transfer transistor Tr1 for green is provided in proximity to the surface S2 of the semiconductor substrate 11, and the n-type region 115n is connected to the FD 116. A p-type region 115p (a hole storage layer) is provided between the n-type region 115n and the surface S2 of the semiconductor substrate 11.

The conductive plug 120a1 may be configured of a conductive semiconductor layer, and is formed so as to be embedded in the semiconductor substrate 11. Since the conductive plug 120a1 serves as an electron transmission path, the conductive plug 120a1 may be made of an n-type semiconductor. Alternatively, the conductive plug 120a1 may be formed, for example, by embedding a conductive material such as tungsten in a through via. To prevent a short circuit between the n-type semiconductor or the conductive material and silicon in a conduction plug 120a1, a side surface of the via may be covered with an insulating film made of silicon oxide ($SiO_2$) or silicon nitride (SiN), among others.

A multilayer wiring layer 51 is provided in contact with the surface S2 of the semiconductor substrate 11 (refer to FIG. 1). The multilayer wiring layer 51 includes a plurality of wiring lines 51a, arranged with an interlayer insulating film 52 in between. The multilayer wiring layer 51 may be bonded to a supporting substrate 53 made of silicon, and the multilayer wiring layer 51 is disposed between the supporting substrate 53 and the semiconductor substrate 11.

The organic photoelectric conversion section 11G is a photoelectric conversion device configured to generate electron-hole pairs by absorbing light in a selective wavelength range (green light in this case) by an organic photoelectric conversion layer 16 made of an organic semiconductor material. An on-chip lens 21 is provided on the organic photoelectric conversion section 11G with a protective film 19 and a planarization layer 20 in between, and light enters the organic photoelectric conversion section 11G through the on-chip lens 21. The signal charges (electrons) generated in the organic photoelectric conversion section 11G are drawn from the lower electrode 14, and holes are emitted through the upper electrode 17.

The organic photoelectric conversion section 11G is formed on the surface S1 serving as a light reception surface of the semiconductor substrate 11 with an interlayer insulating layer 12 in between. Because the back-illuminated type image pickup device is configured by providing the organic photoelectric conversion section 11G on the surface S1 opposed to the surface S2 where the multilayer wiring layer 51 is provided of the semiconductor substrate 11 in the above-described manner, a difference in sensitivity between three photoelectric conversion sections (the organic photoelectric conversion section 11G and the inorganic photoelectric conversion sections 11B and 11R) is reduced. More specifically, because the multilayer wiring layer 51 is not provided between the organic photoelectric conversion section 11G on the surface S1 of the semiconductor substrate 11 and the inorganic photoelectric conversion sections 11B and 11R, in the interior of the semiconductor substrate 11, a distance between the organic photoelectric conversion section 11G and the inorganic photoelectric conversions section 11B and 11R in one pixel is narrowed. Therefore, variation in sensitivity between respective colors caused, depending on the f-number of the on-chip lens 21, is reduced.

The interlayer insulating layer 12 reduces an interface state of the semiconductor substrate 11 (a silicon layer 110), and reduces a dark current from an interface with the silicon layer 110. Such an interlayer insulating layer 12 may use an insulating material with a low interface state, and may be configured of, for example, a laminate film of a hafnium oxide film ($HfO_2$) and a silicon oxide film ($SiO_2$). A through hole is provided in a region facing the conductive plug 120a1, and a conductive plug 120a2 is embedded in the through hole. The conductive plug 120a2 may have a light-shielding function, and may be configured of, for example, a laminate film of titanium (Ti) and titanium nitride (NiN) as a barrier metal and tungsten.

The lower electrode 14 of the photoelectric conversion section 11G is disposed on the interlayer insulating layer 12. The lower electrode 14 is disposed so as to face the light reception surfaces of the inorganic photoelectric conversion sections 11B and 11R, i.e., the lower electrode 14 is disposed directly above the inorganic photoelectric conversion sections 11B and 11R. The lower electrode 14 is made of a light-transmissive conductive material, for example, ITO (Indium-Tin-Oxide). The lower electrode 14 may be made of, for example, a tin oxide ($SnO_2$)-based material or a zinc oxide (ZnO)-based material. The tin oxide-based material is tin oxide doped with a dopant, and examples of the zinc oxide-based material include aluminum zinc oxide (AZO) prepared by doping zinc oxide with aluminum (Al) as a dopant, gallium zinc oxide (GZO) prepared by doping zinc oxide with gallium (Ga) as a dopant, and indium zinc oxide (IZO) prepared by doping zinc oxide with indium (In) as a dopant. In addition, IGZO, CuI, $InSbO_4$, ZnMgO, $CuInO_2$, $MgIn_2O_4$, CdO, or $ZnSnO_3$, among others may be used.

As described above, in the image pickup device 10, signal charges are drawn from the lower electrode 14; therefore, in an image pickup unit (for example, the image pickup unit 1 in FIG. 18 that will be described later) using the image pickup devices 10 as pixels, the lower electrodes 14 of respective pixels are isolated from one another by the inter-pixel insulating film 15. The inter-pixel insulating film 15 may be configured of, for example, a single-layer film made of one kind selected from silicon oxide, silicon nitride, and silicon oxynitride (SiON), or a laminate film made of two or more kinds selected from them. The lower electrodes 14 of respective pixels are electrically isolated from one another by the inter-pixel insulating film 15. For example, a surface of the inter-pixel insulating film 15 may be located at a substantially same position as a surface of the lower electrode 14 to be planarized.

A wiring line 13a is embedded in the inter-pixel insulating film 15, and an end of the wiring line 13a is electrically connected to the conductive plug 120a2, and the other end of the wiring line 13a is electrically connected to the lower electrode 14. In other words, electrons drawn from the lower electrode 14 are stored in the green storage layer 110G through the wiring line 13a and the conductive plugs 120a1 and 120a2. The wiring line 13a may be made of, for example, tungsten (W), titanium (Ti), titanium nitride (TiN), or aluminum (Al), among others. As with the conductive plug 120a2, the wiring line 13a may have a light-shielding property, and may be configured of, for example, a laminate film of titanium and titanium nitride, and tungsten.

The organic photoelectric conversion layer 16 is configured of an organic semiconductor that performs photoelectric conversion on light in a specific wavelength range (green light), and allows light in a wavelength range other than the specific wavelength range to pass therethrough. The material of the organic photoelectric conversion layer 16 may have 70% or more transmittance of the light in the other wavelength range. As with the lower electrode 14, the organic photoelectric conversion layers 16 of respective pixels are separated from one another. For example, the organic photoelectric conversion layer 16 may be widened around the lower electrode 14 in planar view.

The organic photoelectric conversion layer 16 may include both an n-type semiconductor 16N and a p-type semiconductor 16P. The organic photoelectric conversion layer 16 may include, for example, a mixture layer (a co-evaporation layer 16PN) of the n-type semiconductor 16N and the p-type semiconductor 16P. Since both the n-type semiconductor 16N and the p-type semiconductor 16P are included, a pn junction plane is formed to form a so-called pin bulk heterostructure. Therefore, the pn junction plane is increased in the organic photoelectric conversion layer 16, and photoelectric conversion efficiency is further enhanced accordingly.

The lower electrode 14 and the upper electrode 17 may be in contact with the n-type semiconductor 16N and the p-type semiconductor layer 16P, respectively. When the organic photoelectric conversion layer 16 is configured in such a manner, electrons of electron-hole pairs generated in the co-evaporation layer 16PN move to the lower electrode 14 through the n-type semiconductor 16N, and holes of the electron-hole pairs move to the upper electrode 17 through the p-type semiconductor layer 16P. Therefore, signal charges easily move, and photoelectric conversion efficiency is enhanced. The p-type semiconductor layer 16P and the n-type semiconductor 16N may be in contact with the lower electrode 14 and the upper electrode 17, respectively. At this time, electrons of the electron-hole pairs generated in the co-evaporation layer 16PN move to the upper electrode 17 through the n-type semiconductor 16N, and holes of the electron-hole pairs move to the lower electrode 14 through the p-type semiconductor layer 16P. As long as the organic photoelectric conversion layer 16 includes the n-type semiconductor 16N and the p-type semiconductor 16P, the organic photoelectric conversion layer 16 may be configured by laminating the n-type semiconductor layer 16N and the p-type semiconductor layer 16P. Alternatively, the organic photoelectric conversion layer 16 may be configured with use of only one of the n-type semiconductor layer 16N and the p-type semiconductor layer 16P. A p-type blocking layer (not illustrated) may be provided between the lower electrode 14 and the n-type semiconductor 16N, and an n-type blocking layer (not shown) may be provided between the upper electrode 17 and the p-type semiconductor 16P. The p-type blocking layer is provided to reduce the generation of a dark current caused by injection of holes from the lower electrode 14, and the n-type blocking layer is provided to reduce the generation of a dark current caused by injection of electrons from the upper electrode 17. An under coat layer (not shown) configured to smooth a rough surface of the lower electrode 14, a buffer film (not shown) configured to reduce deterioration when the upper electrode 17 is formed, and a work function adjustment film (not shown) configured to reduce generation of a dark current by adjusting a work function of the upper electrode 17, among others may be provided.

For the n-type semiconductor 16N and the p-type semiconductor 16P, for example, any one of a quinacridone derivative, a naphthalene derivative, an anthracene derivative, a phenanthrene derivative, a tetracene derivative, a pyrene derivative, a perylene derivative, and a fluoranthene derivative may be used. For the n-type semiconductor 16N and the p-type semiconductor 16P, a polymer such as phenylenevinylene, fluorene, carbazole, indole, pyrene, pyrrole, picoline, thiophene, acetylene, or diacetylene, a derivative thereof, among others may be used. A metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthoquinone, or an anthraquinone-based dye may be used. For the metal complex dye, a dithiol metal complex-based dye, a metal phthalocyanine dye, a metal porphyrin dye, or a ruthenium complex dye may be used. The n-type semiconductor 16N and the p-type semiconductor 16P may be made of a fused polycyclic aromatic group such as anthracene or pyrene, or a chain compound prepared by fusing an aromatic ring or a heterocyclic compound. A compound prepared by bonding two or more nitrogen-containing heterocyclic rings such as quinoline, benzothiazole, or benzoxazole with use of a squarylium group and a croconic methine group as a joining chain, a cyanine-like dye bonded by a squarylium group and a croconic methine group, among others may be used.

The upper electrode 17 faces the lower electrode 14 with the organic photoelectric conversion layer 16 in between, and the planar shape of the upper electrode 17 is substantially the same as the planar shape of the organic photoelectric conversion layer 16. A surface facing the upper electrode 17 of the organic photoelectric conversion layer 16 serves as a light incident surface. As with the lower electrode 14, the upper electrode 17 is made of a light-transmissive conductive material.

In this embodiment, the ultraviolet absorption film 18 is disposed on the upper electrode 17 of the organic photoelectric conversion section 11G. In other words, the light incident surface of the organic photoelectric conversion layer 16 is covered with the ultraviolet absorption film 18. As will be described in detail later, this allows plasma irradiation or other processes to be performed when the organic photoelectric conversion layer 16 is patterned, and the shape of the organic photoelectric conversion layer 16 may thereby be controlled with greater ease and accuracy. Therefore, downsizing of the pixel configured of the image pickup device 10 is advantageously achievable.

The ultraviolet absorption film 18 is configured to prevent ultraviolet rays generated when the image pickup device 1 is formed from reaching the organic photoelectric conversion layer 16, and may absorb, for example, light of a wavelength of approximately 400 nm or less.

FIG. 4 shows an illustrative example of a light absorption property of the ultraviolet absorption film 18. In the ultraviolet absorption film 18, transmittance of light of a wavelength of approximately 400 nm or less may be approximately 80% or less. The ultraviolet absorption film 18 may absorb light in an entire wavelength range of approximately 400 nm or less, or may absorb light in a part of the wavelength range. For example, approximately 90% or more of visible light passes through the ultraviolet absorption film 18 to reach the organic photoelectric conversion section 11G and the inorganic photoelectric conversion sections 11B and 11R. The ultraviolet absorption film 18 may have 80% or more transmittance of visible light. For the ultraviolet absorption film 18, for example, silicon nitride (SiN), silicon oxide (SiO), silicon oxynitride (SiON), aluminum oxide (AlO), and aluminum nitride (AlN), among others may be used. The ultraviolet absorption film 18 may be configured of a single-layer film made of one kind selected from these materials, or a laminate of two or more kinds of films. For the ultraviolet absorption film 18, a material that reflects a part of light of a wavelength of approximately 400 nm or less may be used, and, for example, metal oxides such as titanium oxide (TiO), vanadium oxide (VO) and chromium oxide (CrO) may be used for the ultraviolet absorption film 18. The ultraviolet absorption film 18 may have, for example, a thickness of approximately 10 nm to approximately 500 nm, both inclusive. The ultraviolet protective film may advantageously have a thickness of at least approximately 100 nm or at least approximately 200 nm.

To suppress film peeling among others caused by a load onto the organic photoelectric conversion layer 16, a stress of the ultraviolet absorption film 18 may be small. The stress of the ultraviolet absorption film 18 may be a tensile stress or a compressive stress; however, an absolute value of the stress may be, for example, approximately 500 MPa or less.

The stress may be relaxed by providing an opening among others to the ultraviolet absorption film 18.

The planar shape of such an ultraviolet absorption film 18 is substantially the same as the planar shapes of the upper electrode 17 and the organic photoelectric conversion layer 16. In other words, ends of the ultraviolet absorption film 18, the upper electrode 17, and the organic photoelectric conversion layer 16 are substantially aligned.

As shown in FIG. 5, the illustrative positions of the ends of the ultraviolet absorption film 18, the upper electrode 17, and the organic photoelectric conversion layer 16 may be different from one another; however, for example, the ends of the ultraviolet absorption film 18, the upper electrode 17, and the organic photoelectric conversion layer 16 may be located within a range of approximately 500 nm from one another.

The protective film 19 is disposed over the ultraviolet absorption film 18 and the inter-pixel insulating film 15, and a top surface of the ultraviolet absorption film 18 and side surfaces of the ultraviolet absorption film 18, the upper electrode 17, and the organic photoelectric conversion layer 16 are covered with the protective film 19. A wiring line 13*b* electrically connected to the upper electrode 17, is embedded in the protective film 19. An end of the wiring line 13*b* is electrically connected to the upper electrode 17 through, for example, a connection hole of the ultraviolet absorption film 18, and the other end of the wiring line 13*b* is electrically connected to the wiring line 51*a* of the multilayer wiring layer 51. Therefore, holes generated in the organic photoelectric conversion layer 16 are emitted through the upper electrode 17 and the wiring line 13*b*. A material similar to that of the wiring line 13*a* may be used for the wiring line 13*b*. The protective film 19 has light transmittance, and may be configured of, for example, one of single-layer films of silicon nitride, silicon oxide, and silicon oxynitride, among others, or a laminate film of two or more kinds selected from the single-layer films. The protective film 19 may have a thickness of, for example, approximately 100 nm to approximately 300 nm.

The planarization layer 20 is disposed on an entire surface of the protective film 19, and the on-chip lens 21 is disposed on the planarization layer 20. The on-chip lens 21 is configured to condense light incident thereon from above on the light reception surfaces of the organic photoelectric conversion section 11G and the inorganic photoelectric conversion sections 11B and 11R. As described above, in the back-illuminated type image pickup device 10, a distance between the on-chip lens 21 and the light reception surfaces of the inorganic photoelectric conversion sections 11B and 11R are narrowed; therefore, variation in sensitivity between respective colors caused, depending on the f-number of the on-chip lens, 21 is reduced. The planarization layer 20 may be configured of, for example, an acrylic-based resin material, a styrene-based resin material, and an epoxy-based resin material, among others.

(Method of Manufacturing Image Pickup Device 10)

For example, such an image pickup device 10 may be manufactured as follows (refer to FIGS. 6A to 10D).

First, the semiconductor substrate 11 is formed. As illustrated in FIG. 6A, a substrate (a so-called SOI substrate) including a silicon oxide film 1102 between a silicon base 1101 and the silicon layer 110 is prepared, and the conductive plug 120*a*1 is formed in the silicon layer 110. A surface in contact with the silicon oxide film 1102 of the silicon layer 110 serves as the surface S1 of the semiconductor substrate 11. The conductive plug 120*a*1 may be formed, for example, by forming a through via in the silicon layer 110 and embedding an insulating film of silicon nitride among others and tungsten in the through via. Alternatively, for the conductive plug 120*a*1, a conductive impurity semiconductor layer may be formed by ion implantation into the silicon layer 110. Next, the inorganic photoelectric conversion sections 11B and 11R are formed so as to be superimposed on each other in regions different in depth from each other in the silicon layer 110. The green storage layer 110G is formed by ion implantation together with the inorganic photoelectric conversion sections 11B and 11R (refer to FIG. 6B). Peripheral circuits including pixel transistors, such as transfer transistors Tr1, Tr2, and Tr3 and a logic circuit, are provided in proximity to the surface S2 of the semiconductor substrate 11. Thus, the semiconductor substrate 11 is formed.

Next, as illustrated in FIG. 7, the multilayer wiring layer 51 is formed on the surface S2 of the semiconductor substrate 11. A plurality of wiring lines 51*a* are provided in the multilayer wiring layer 51 so as to be arranged with the interlayer insulating film 52 in between. Next, after the supporting substrate 53 is bonded to the multilayer wiring layer 51, the silicon oxide film 1102 and the silicon base 1101 are separated from the silicon layer 110 to expose the surface S1 of the silicon layer 110 (refer to FIG. 8). After that, as illustrated in FIG. 9, a hafnium oxide film formed by, for example, an atomic layer deposition (ALD) method and a silicon oxide film formed by a plasma CVD (Chemical Vapor Deposition) method, are provided in this order on the surface S1 of the semiconductor substrate 11 to form the interlayer insulating layer 12.

Next, after a connection hole is provided at a position facing the conductive plug 120*a*1 in the interlayer insulating layer 12, a conductive film is formed on the interlayer insulating layer 12 to embed a conductive material in the connection hole. Thus, the conductive plug 120*a*2 is formed. Although not illustrated, the conductive film on the interlayer insulating layer 12 is patterned into a desired shape to form the wiring line 13*a* together with the conductive plug 120*a*2.

Next, the lower electrode 14 is formed on the interlayer insulating layer 12. The lower electrode 14 is formed by forming an ITO film with a thickness of 50 nm by, for example, a sputtering method, and then patterning the ITO film by a photolithography technique and performing dry etching or wet etching on the ITO film. After the lower electrode 14 is formed, a silicon oxide film is formed on the lower electrode 14 and the interlayer insulating layer 12 by, for example, a plasma CVD method to form the interpixel insulating film 15. The inter-pixel insulating film 15 is planarized by, for example, CMP (Chemical Mechanical Polishing) among others (refer to FIG. 10A). In FIG. 10A, the supporting substrate 53, the multilayer wiring layer 51, and the semiconductor substrate 11 are not illustrated. This is applicable to FIGS. 10B to 10D.

After the inter-pixel insulating film 15 is provided, for example, an organic photoelectric conversion material film 16A is formed on an entire surface of the semiconductor substrate 11 by a vacuum deposition method or a coating method. The organic photoelectric conversion material film 16A includes, for example, the n-type semiconductor 16N and the p-type semiconductor 16P. Next, a transparent conductive film 17A and an ultraviolet absorption material film 18A are formed, in this order, on an entire surface of the organic photoelectric conversion material film 16A (refer to FIG. 10B). The organic photoelectric conversion material film 16A has properties that easily vary by influences of water, oxygen, and hydrogen, among others. Therefore, the organic photoelectric conversion material film 16A and the transparent conductive film 17A may be formed in succession in a vacuum atmosphere (in a vacuum integrated process). The transparent conductive film 17A is formed by, for example, a sputtering method. The ultraviolet absorption material film 18A is formed by, for example, a CVD (Chemical Vapor Deposition) method. For example, the ultraviolet absorption material film 18A made of a silicon nitride film is formed under, for example, the following conditions. The ultraviolet absorption material film 18A is formed with use of a parallel-plate type plasma CVD unit under conditions of RF power of 500 W, a substrate temperature of 200 degrees, a pressure of 5 Torr, a nitrogen ($N_2$) flow rate of 5000 sccm, a silane ($SiH_4$) flow rate of 500 sccm, and an ammonia ($NH_3$) flow rate of 100 sccm. The ultraviolet absorption material film 18A exhibits the above-described light absorption property shown in FIG. 4.

After the ultraviolet absorption material film 18 is provided, a resist film 31, with a predetermined pattern, is formed on the ultraviolet absorption material film 18A (refer to FIG. 10C), and the ultraviolet absorption material film 18A, the transparent conductive film 17A, and the organic photoelectric conversion material film 16A are patterned. Thus, the ultraviolet absorption film 18, the upper electrode 17, and the organic photoelectric conversion layer 16, that have substantially the same planar shape as one another, are formed (refer to FIG. 10D). More specifically, the resist film 31, with the predetermined pattern, is formed with use of a photolithography technique, and then dry etching is performed on the ultraviolet absorption material film 18A, the transparent conductive film 17A, and the organic photoelectric conversion material film 16A by, for example, plasma irradiation. At this time, since ultraviolet rays generated by plasma irradiation are blocked by the ultraviolet absorption material film 18A, ultraviolet rays are less likely to reach the organic photoelectric conversion material film 16A. After the dry etching is performed, ashing and cleaning with an organic solvent are performed to remove a deposit, and a residue, among others, from the resist film 31. Instead of the organic solvent, cleaning may be performed with the use of a dilute hydrofluoric acid among others.

After the ultraviolet absorption film 18, the upper electrode 17, and the organic photoelectric conversion layer 16 are provided, the wiring line 13b and the protective film 19 are formed. The protective film 19 is formed by forming a film of silicon nitride or silicon oxide on the ultraviolet absorption film 18 by, for example, a plasma CVD method. After the protective film 19 is formed, a connection hole penetrating through the ultraviolet absorption film 18 is formed at a position facing the upper electrode 17 in the protective film 19. Next, the wiring line 13b is formed on the protective film 19, so as to be embedded in the connection hole. The wiring line 13b is formed with the use of, for example, a photolithography technique and etching. Next, after the planarization layer 20 is formed on the protective film 19, the on-chip lens 21 is formed on the planarization layer 20. The image pickup device 10 shown in FIG. 1 is completed by the above-described processes.

(Operation of Image Pickup Device 10)

In such an image pickup device 10, for example, as a pixel of the image pickup unit, signal charges (electrons) are obtained in the following manner. When light L enters the image pickup device 10 through the on-chip lens 21, shown in FIG. 1 (refer to FIG. 11), the light L passes through the organic photoelectric conversion section 11G, the inorganic photoelectric conversion section 11B, and the inorganic photoelectric conversion section 11R in this order, and green light, blue, light, and red light of the light L are photoelectrically converted in the course of passing. More specifically, as illustrated in FIG. 12, first, green light Lg of the light L incident on the image pickup device 10, is selectively detected (absorbed) by the organic photoelectric conversion section 11G to be photoelectrically converted. Electrons Eg of electron-hole pairs generated in the organic photoelectric conversion section 11G. are drawn from the lower electrode 14 to be stored in the green storage layer 110G through a transmission path A (the wiring line 13a and the conductive plugs 120a1 and 120a2). The stored electrons Eg are transferred to the FD 116 in a reading operation. On the other hand, holes Hg are emitted from the upper electrode 17 through a transmission path B (the wiring line 13b).

In the image pickup device 10, a predetermined negative potential VL (<0 V) and a potential VU (<VL) lower than the potential VL are applied to the lower electrode 14 and the upper electrode 17, respectively. Therefore, in a charge storing state (an OFF state of the reset transistor (not illustrated) and the transfer transistor Tr1), electrons of the electron-hole pairs generated in the organic photoelectric conversion section 11G are guided to the lower electrode 14 with a relatively high potential. The electrons Eg are drawn from the lower electrode 14 to be stored in the green storage layer 110G (more specifically, the n-type region 115n) through the transmission path A. When the electrons Eg are stored, the potential VL of the lower electrode 14 brought into conduction with the green storage layer 110G is changed. A change amount of the potential VL corresponds to a signal potential (a potential of a green signal in this case). It is to be noted that, for example, the potential VL is supplied from the wiring line 51a of the multilayer wiring layer 51 to the lower electrode 14 through the transmission path A, and, for example, the potential VU is supplied from the wiring line 51a of the multilayer wiring layer 51 to the upper electrode 17 through the transmission path B.

In the reading operation, the transfer transistor Tr1 is turned to an ON state, and the electrons Eg stored in the green storage layer 110G is transferred to the FD 116. Accordingly, a green signal based on a light reception amount of the green light Lg is read to the vertical signal line Lsig (refer to FIG. 20 that will be described later) through, for example, a pixel transistor (not shown). After that, the reset transistor (not illustrated) and the transfer transistor Tr1 are turned to an ON state, and the FD 116 as the n-type region and a storage region (the n-type region 115n) of the green storage layer 110G are reset to, for example, a power supply voltage VDD.

Blue and red lighthaving passed through the organic photoelectric conversion section 11G are absorbed by the inorganic photoelectric conversion section 11B and the inorganic photoelectric conversion section 11R, respectively, to be photoelectrically converted. In the inorganic photoelectric conversion section 11B, electrons Eb corresponding to incident blue light are stored in the n-type region (the n-type photoelectric conversion layer 111n). The stored electrons Eb are transferred to the FD 113 in the reading operation. At this time, holes generated in the inorganic photoelectric conversion section 11B are stored in the p-type region (not shown in FIG. 12). This is also applicable to the inorganic photoelectric conversion section 11R. In the inorganic photoelectric conversion section 11R, electrons Er corresponding to incident red light are stored in the n-type region (the n-type photoelectric conversion layer 112n). The stored electrons Er are transferred to the FD 114 in the reading operation. At this time, holes generated in the inorganic photoelectric conversion section 11R are stored in the p-type region (not shown in FIG. 12).

In the charge storing state, as described above, since the negative potential VL is applied to the lower electrode 14, a hole concentration in the p-type region (the p-type region 111*p* in FIG. 2) as a hole storage layer of the inorganic photoelectric conversion section 11B is easily increased. Therefore, the generation of a dark current at an interface between the p-type region 111 and the interlayer insulating layer 12 is reduced.

The reading operations of the inorganic photoelectric conversion sections 11B and 11R are performed in a manner similar to the above-described organic photoelectric conversion section 11G. The transfer transistors Tr2 and Tr3 are turned to an ON state, and the electrons Eb and Er stored in the n-type photoelectric conversion layers 111*n* and 112*n* are transferred to the FDs 113 and 114, respectively. Accordingly, a blue signal based on a light reception amount of the blue light Lb and a red signal based on a light reception amount of the red light Lr are read to the vertical signal line Lsig (refer to FIG. 20 that will be described later) through, for example, the pixel transistor (not shown). After that, the reset transistor (not shown) and the transfer transistors Tr2 and Tr3 are turned to the ON state, and the FDs 113 and 114 as the n-type regions are reset to, for example, the power supply voltage VDD.

(Functions and Effects of Image Pickup Device 10)

As described above, when the organic photoelectric conversion section 11G and the inorganic photoelectric conversion sections 11B and 11R, are laminated along the vertical direction, red light, green light, and blue light are separately detected without providing a color filter to obtain signal charges of respective colors. Therefore, light loss (reduction in sensitivity) due to color light absorption by the color filter or generation of a false color associated with pixel interpolation processing is reduced.

In the image pickup device 10, because the light incident surface of the organic photoelectric conversion layer 16 is covered with the ultraviolet absorption film 18, the shape of the organic photoelectric conversion section 11G is controlled accurately. This will be described below.

FIGS. 13A and 13B show processes of manufacturing an image pickup device according to an illustrative comparative example. In a method of manufacturing this image pickup device, first, a metal mask 32 is placed on a semiconductor substrate, and then an organic photoelectric conversion layer 160 is formed in an opening of the metal mask 32 with use of an evaporation method (refer to FIG. 13A). Next, a metal mask 33 is placed with consideration of misalignment with the organic photoelectric conversion layer 160, and then an upper electrode 170 is formed on the organic photoelectric conversion layer 160 (refer to FIG. 13B). At this time, for example, the upper electrode 170 is widened around the organic photoelectric conversion layer 160, and an outer edge of the organic photoelectric conversion layer 160 is covered with the upper electrode 170. In such a method of forming the organic photoelectric conversion section with use of the metal masks 32 and 33, a margin portion with consideration of misalignment between masks in the organic photoelectric conversion section is easily increased, and it is difficult to accurately control the shape of the organic photoelectric conversion section. For example, the size of the margin portion on one side of the organic photoelectric conversion section formed with use of the metal masks 32 and 33 is approximately 500 mm, and the size of an entire margin portion of the organic photoelectric conversion section may be, for example, approximately 1000 mm.

For example, the organic photoelectric conversion layer is patterned accurately and easily with use of a dry etching method. Even though the organic photoelectric conversion layer is formed by a photolithography technique and dry etching, a margin portion organic photoelectric conversion layer is formed by misalignment and side etching; however, the size of the margin portion on one side of the organic photoelectric conversion layer may be, for example, approximately 0.5 mm. In other words, the size of the margin portion of the organic photoelectric conversion layer is reduced to approximately $\frac{1}{1000}$ of the size of the margin portion of the organic photoelectric conversion section formed with use of the metal masks 32 and 33. However, in the dry etching method, plasma is used; therefore, ultraviolet rays are generated by the plasma. When the ultraviolet rays enter the organic photoelectric conversion layer, quantum efficiency of the organic photoelectric conversion layer may be reduced.

On the other hand, in the image pickup device 10, because the light incident surface of the organic photoelectric conversion layer 16 is covered with the ultraviolet absorption film 18, even if ultraviolet rays are generated, the ultraviolet rays are blocked before reaching the organic photoelectric conversion layer 16. In other words, even if dry etching is used for patterning on the organic photoelectric conversion layer 16, reduction in quantum efficiency of the organic photoelectric conversion layer 16 is preventable. In the image pickup device 10, compared to a case where dry etching is performed without providing the ultraviolet absorption film 18, quantum efficiency is enhanced by approximately 2.8 times (an electric field strength of 0.1 mV/cm). This quantum efficiency is substantially equal to quantum efficiency of the organic photoelectric conversion section formed by the above-described method shown in FIGS. 13A and 13B. Thus, the shape of the organic photoelectric conversion section 11G is controlled accurately to downsize the pixel.

Moreover, even in processes after the organic photoelectric conversion section 11G is formed, ultraviolet rays are blocked by the ultraviolet absorption film 18 before reaching the organic photoelectric conversion layer 16. Therefore, deterioration of the organic photoelectric conversion layer 16 is reduced, and yields of the image pickup device 10 are stabilized.

As described above, in this embodiment, the light incident surface of the organic photoelectric conversion layer 16 is covered with the ultraviolet absorption film 18; therefore, the pixel configured of the image pickup device 10, is downsized.

Modification examples of the above-described embodiment and other embodiments will be described below. In the following description, like components are denoted by like numerals as of the above-described embodiment and will not be further described.

MODIFICATION EXAMPLE 1

FIG. 14 shows an illustrative sectional configuration of an image pickup device (an image pickup device 10A) according to Modification Example 1 of the above-described embodiment. The image pickup device 10A includes organic photoelectric conversion sections 11BA and 11RA together with the organic photoelectric conversion section 11G, on the semiconductor substrate 11. The image pickup device 10A has a configuration similar to the image pickup device 10, except for this point, and has functions and effects similar to those of the image pickup device 10.

In the image pickup device 10A, a photoelectric conversion section (the inorganic photoelectric conversion sections 11B and 11R) is not provided in the interior of the semiconductor substrate 11, and a plurality of organic photoelectric conversion sections 11G, 11BA, and 11RA are provided on the semiconductor substrate 11. The organic photoelectric conversion sections 11G, 11BA, and 11RA may be disposed on the semiconductor substrate 11, for example, in order of the organic photoelectric conversion section 11RA, the organic photoelectric conversion section 11G, and the organic photoelectric conversion section 11BA. In other words, light incident through the on-chip lens 21 passes through the organic photoelectric conversion section 11BA, the organic photoelectric conversion section 11G, and the organic photoelectric conversion section 11RA in this order.

As with the organic photoelectric conversion section 11G, the organic photoelectric conversion sections 11BA and 11RA include lower electrodes 14B and 14R, organic photoelectric conversion layers 16B and 16R, and upper electrodes 17B and 17R, respectively. The lower electrodes 14B are isolated from one another by the inter-pixel insulating film 15B, and the lower electrodes 14R are isolated from one another by the inter-pixel insulating film 15R. As with the organic photoelectric conversion layer 16 of the organic photoelectric conversion section 11G, light incident surfaces of the organic photoelectric conversion layer 16B and 16R of the organic photoelectric conversion sections 11BA and 11RA are covered with ultraviolet absorption films 18B and 18R, respectively. The ultraviolet absorption film 18B may be provided to only the organic photoelectric conversion section 11BA where light first enters of the organic photoelectric conversion sections 11G, 11BA, and 11RA; however, the ultraviolet absorption films 18, 18B, and 18R, may be provided to the organic photoelectric conversion sections 11G, 11BA, and 11RA, respectively. Even in such a case, as with the above-described first embodiment, when the organic photoelectric conversion layers 16B and 16R are patterned, dry etching is used. Therefore, the pixel configured of the image pickup device 10A is downsized.

In the image pickup device 10A, instead of the semiconductor substrate 11, a transparent substrate made of glass among others may be used. The transparent substrate may be made of a resin material, and as the resin material, for example, polyethylene terephthalate, polyimide, polyethersulfone, polycarbonate, among others may be used.

MODIFICATION EXAMPLE 2

As illustrated in FIG. 15, holes may be drawn from the lower electrode 14 as signal charges to be stored in a green storage layer (a green storage layer 110G1) (Modification Example 2).

In such an image pickup device 10, the configuration of each component on the surface S1 of the semiconductor substrate 11 is the same as that in the above-described first embodiment; however, the configurations of the green storage layer 110G1 and a floating diffusion (FD 116a) in the semiconductor substrate 11 are different from those in the first embodiment. In the green storage layer 110G1, the p-type region 115p of the hole storage layer is connected to the conductive plug 120a1, and the n-type region 115n of the electron storage layer is provided between the p-type region115p and the surface S2 of the semiconductor substrate 11. The FD 116a is formed as the p-type region.

Holes are stored in the green storage layer 110G1 in the following manner. When the potential VL that is lower than the potential of the upper electrode 17 is applied to the lower electrode 14, holes of electron-hole pairs generated in the organic photoelectric conversion section 11G are guided to the lower electrode 14. The holes are stored in the p-type region 115p of the green storage layer 110G1 through the wiring line 13a (refer to FIG. 1) and the conductive plugs 120a1 and 120a2. In the reading operation, the stored holes are transferred to the FD 116a.

MODIFICATION EXAMPLE 3

As illustrated in FIG. 16, signal charges may be drawn from the upper electrode 17 (Modification Example 3).

In such an image pickup device 10, a green storage layer (a green storage layer 110G2) in the semiconductor substrate 11 is connected to the conductive plug 120a1, and is electrically connected to the upper electrode 17 through a conductive plug 120a2 and a wiring line 13c. When the configurations of the green storage layer 110G2 and a floating diffusion are similar to those in the above-described first embodiment, electrons are drawn from the upper electrode 17 as signal charges to be stored in the green storage layer 110G2. A potential applied to the upper electrode 14 is set to be higher than a potential applied to the lower electrode 14. Holes are emitted from the lower electrode 14 through a wiring line (not shown).

On the other hand, when the configurations of the green storage layer 110G2 and the floating diffusion are similar to those in the above-described Modification Example 2, holes are drawn from the upper electrode 17 as signal charges to be stored in the green storage layer 110G2. At this time, the potential applied to the upper electrode 17 is set to be lower than the potential applied to the lower electrode 14. Electrons are then emitted from the lower electrode 14 through a wiring line (not shown).

(Second Embodiment)

FIG. 17 shows an illustrative sectional configuration of an image pickup device (an image pickup device 60) according to a second embodiment of the present technology. The image pickup device 60 includes an ultraviolet reflective film (an ultraviolet reflective film 68) on the organic photoelectric conversion layer 16. The image pickup device 60 has a configuration similar to the image pickup device 10, except for this point, and has functions and effects similar to those of the image pickup device 10.

As with the ultraviolet absorption film 18 (refer to FIG. 1) of the image pickup device 10, the light incident surface of the organic photoelectric conversion layer 16 is covered with the ultraviolet reflective film 68 with the upper electrode 17 in between, and the ultraviolet reflective film 68 blocks ultraviolet rays from entering the organic photoelectric conversion layer 16. Such an ultraviolet reflective film 68 may have, for example, high reflectivity for light of a wavelength of approximately 400 nm or less, and may be made of, for example, aluminum (Al), titanium (Ti), tungsten (W), or titanium nitride (TiN), among others. Even in such a case, as with the above-described first embodiment, dry etching is used when the organic photoelectric conversion layer 16 is patterned. Therefore, a pixel configured of the image pickup device 60 is downsized.

APPLICATION EXAMPLES

FIG. 18 shows an entire illustrative configuration of a solid-state image pickup unit (an image pickup unit 1) using, as each pixel, any one of the image pickup devices (the image pickup devices 10, 10A, and 60) described in the above-described embodiments and the above-described modification examples. The image pickup unit 1 is a CMOS image sensor, and includes a pixel section 1a as an image pickup area in a central portion on a semiconductor substrate 11. For example, a peripheral circuit section 130 including a row scanning section 131, a system control section 132, a horizontal selection section 133, and a column scanning section 134 are provided to a region peripheral to the pixel section 1a.

The pixel section 1a may include, for example, a plurality of unit pixels P (corresponding to the image pickup devices 10, 10A, and 10B) that are two-dimensionally arranged in a matrix form. Respective pixel drive lines Lread (more specifically, row selection lines and reset control lines) may be wired to, for example, respective pixel rows of the unit pixels P, and respective vertical signal lines Lsig may be wired to respective pixel columns of the unit pixels P. Each of the pixel drive line Lread is configured to transmit a drive signal for signal reading from the pixel, and an end of each of the pixel drive line Lread is connected to an output end corresponding to each of the pixel rows of the row scanning section 131.

The row scanning section 131 is configured of a shift register, and an address decoder, among others, and is a pixel drive section that drives respective pixels P, of the pixel section 1a, from one row to another. Signals output from the respective pixels P, in a pixel row selected by the row scanning section 131, are supplied to the horizontal selection section 133 through the respective vertical signal lines Lsig. The horizontal selection section 133 may be configured of an amplifier, and a horizontal selection switch, among others, provided to each of the vertical signal lines Lsig.

The column scanning section 134 is configured of a shift register, an address decoder, and the like, and sequentially drives respective horizontal selection switches of the horizontal selection section 133, while scanning the horizontal selection switches. Signals of the respective pixels P, transmitted through the respective vertical signal lines Lsig, are sequentially output to a horizontal signal line 135 by selection scanning by the column scanning section 134, and are transmitted to a device external to the semiconductor substrate 11 through the horizontal signal line 135.

A circuit portion configured of the row scanning section 131, the horizontal selection section 133, the column scanning section 134, and the horizontal signal line 135 may be formed directly above the semiconductor substrate 11, or may be disposed in an external control IC. The circuit portion may be provided to another substrate connected by a cable, among others.

The system control section 132 is configured to receive data indicating a clock, an operation mode, among others supplied from a device external to the semiconductor substrate 11, and to output internal information of the image pickup unit 1. In addition to this, the system control section 132 may include, for example, a timing generator that generates various kinds of timing signals, and may perform drive control on peripheral circuits such as the row scanning section 131, the horizontal selection section 133, and the column scanning section 134, among others, in response to the various kinds of timing signals generated by the timing generator.

Such an image pickup unit 1 is mounted in all kinds of electronic apparatuses having an image pickup function, and is applicable to, for example, camera systems such as digital still camera and video cameras, and cellular phones. FIG. 19 shows a schematic configuration illustrative of a camera (an electronic apparatus 2) as an example. The electronic apparatus 2 may be, for example, a video camera capable of taking a still image or a moving image, and includes the image pickup unit 1, an optical system (an optical lens) 310, a shutter unit 311, a signal processing section 312, and a drive section 313.

The optical system 310 is configured to guide image light (incident light) from a subject to the pixel section 1a of the image pickup unit 1. The optical system 310 may include a plurality of optical lenses. The shutter unit 311 controls a light irradiation period and a light-shielding period for the image pickup unit 1, and the drive section 313 controls a shutter operation of the shutter unit 311 and a transfer operation of the image pickup unit 1. The signal processing section 312 performs various kinds of signal processing on a signal output from the image pickup unit 1. For example, an image signal Dout that has been subjected to signal processing may be stored in a storage medium such as a memory, or may be output to a monitor among others.

Although the present technology is described referring to the above-described embodiments and the above-described modification examples, the present technology is not limited thereto, and may be variously modified. For example, in the above-described embodiments and the like, the image pickup devices 10 and 60, in which the organic photoelectric conversion section 11G detecting green light and the inorganic photoelectric conversion sections 11B and 11R, detecting red light and blue light, respectively, are laminated are described; however, the present technology is not limited thereto. For example, an organic photoelectric conversion section may detect red light or blue light, and an inorganic photoelectric conversion section may detect green light. The number of organic photoelectric conversion sections, the number of inorganic photoelectric conversion sections, a ratio between the organic photoelectric conversion sections, and the inorganic photoelectric conversion sections are not limited to the above-described example, and, for example, two or more organic photoelectric conversion sections may be provided. Photoelectric conversion sections (organic photoelectric conversion sections and inorganic photoelectric conversion sections) may not only be laminated along the vertical direction, but also be arranged side by side along a semiconductor substrate surface.

Moreover, in the above-described embodiments, among others, the configurations of the back-illuminated type image pickup devices 10, 10A, and 60, are exemplified; however, the present technology is applicable to a front-illuminated type image pickup device.

Further, it is not necessary to include all components described in the above-described embodiments, among others, and any other component may be included.

It is to be noted that the present technology may have the following illustrative configurations.

(A1) A solid-state image-pickup device including: one or more first photoelectric conversion sections; a second photoelectric conversion section disposed at a position facing the first photoelectric conversion section and including an organic layer, the second photoelectric conversion section that light first enters; and an ultraviolet protective film with which a light incident surface of the organic layer is covered. (A2) The solid-state image-pickup device according to (A1), in which the second photoelectric conversion section includes an upper electrode between the ultraviolet protective film and the organic layer, and a lower electrode facing the upper electrode with the organic layer in between. (A3) The solid-state image-pickup device according to (A2), in which the ultraviolet protective film, the upper electrode, and the organic layer have a same planar shape. (A4) The solid-state image-pickup device according to any one of (A1) to (A3), in which the ultraviolet protective film absorbs a part or a whole of light of a wavelength of about 400 nm or less. (A5) The solid-state image-pickup device according to (A4), in which the ultraviolet protective film has about 80% or less transmittance of the light of the wavelength of about 400 nm or less. (A6) The solid-state image-pickup device according to any one of (A1) to (A5), in which the ultraviolet protective film allows visible light to pass therethrough. (A7) The solid-state image-pickup device according to (A6), in which the ultraviolet protective film has about 80% or more transmittance of visible light. (A8) The solid-state image-pickup device according to any one of (A1) to (A7), in which an absolute value of a stress of the ultraviolet protective film is about 500 MPa or less. (A9) The solid-state image-pickup device according to any one of (A1) to (A8), in which the ultraviolet protective film includes one or more kinds selected from a group consisting of silicon nitride, silicon oxide, silicon oxynitride, aluminum oxide, aluminum nitride, titanium oxide, vanadium oxide, and chromium oxide. (A10) The solid-state image-pickup device according to any one of (A1) to (A9), further including a substrate on which the second photoelectric conversion section is disposed. (A11) The solid-state image-pickup device according to (A10), in which the first photoelectric conversion section is included at a position superimposed on the second photoelectric conversion section in planar view in an interior of the substrate. (A12) The solid-state image-pickup device according to any one of (A1) to (A11), in which the ultraviolet protective film reflects a part or a whole of light of a wavelength of about 400 nm or less. (A13) The solid-state image-pickup device according to (A2), in which the organic layer includes a first conductive semiconductor and a second conductive semiconductor, and one of the upper electrode and the lower electrode is in contact with the first conductive semiconductor, and the other one is in contact with the second conductive semiconductor. (A14) The solid-state image-pickup device according to any one of (A1) to (A13), in which the second photoelectric conversion section absorbs light in a specific wavelength range. (A15) The solid-state image-pickup device according to (A14), in which he second photoelectric conversion section has about 70% or more transmittance of light in a wavelength range other than the specific wavelength range. (A16) An electronic apparatus provided with a solid-state image-pickup device, the solid-state image-pickup device including: one or more first photoelectric conversion sections; a second photoelectric conversion section disposed at a position facing the first photoelectric conversion section and including an organic layer, the second photoelectric conversion section that light first enters; and an ultraviolet protective film with which a light incident surface of the organic layer is covered. (A17) A method of manufacturing a solid-state image-pickup device, the method including: forming an organic layer at a position facing one or more first photoelectric conversion sections; and covering a light incident surface of the organic layer with an ultraviolet protective film, and then patterning the organic layer to form a second photoelectric conversion section.

[B1] A solid-state image-pickup device, including: at least one first photoelectric conversion section disposed in a substrate; a second photoelectric conversion section disposed over the substrate and including an organic photoelectric conversion layer; and an ultraviolet protective film that covers a light incident surface of the organic photoelectric conversion layer. [B2] The solid-state image-pickup device according to [B1], where light enters the ultraviolet protective film before the light enters the organic photoelectric conversion layer. [B3] The solid-state image-pickup device according to [B1], where the second photoelectric conversion section includes an upper electrode between the ultraviolet protective film and the organic photoelectric conversion layer, and a lower electrode between the organic photoelectric conversion layer and the substrate. [B4] The solid-state image-pickup device according to [B1], where the light includes light having a wavelength of approximately 400 nm or less, and the ultraviolet protective film absorbs approximately 20% or more of the light having a wavelength of approximately 400 nm or less. [B5] The solid-state image-pickup device according to [B1], where the ultraviolet protective film has a thickness of at least approximately 200 nm. [B6] The solid-state image-pickup device according to [B1], where the organic photoelectric conversion layer is between an upper electrode and a lower electrode, and where an end of the organic photoelectric conversion layer, an end of the upper electrode, and an end of the ultraviolet protective film are within approximately 500 nm from each other. [B7] The solid-state image-pickup device according to [B6], where the organic photoelectric conversion layer has a side surface on the end of the organic photoelectric conversion layer, the upper electrode has a side surface on the end of the upper electrode, and the ultraviolet protective film is in contact with an entire top surface of the organic photoelectric conversion layer and is in contact with the side surface on the end of the organic photoelectric conversion layer and the side surface on the end of the upper electrode. [B8] The solid-state image-pickup device according to [B1], where the ultraviolet protective film is selected from the group consisting of silicon nitride (SiN), silicon oxide (SiO), silicon oxynitride (SiON), aluminum oxide (AlO), titanium oxide (TiO), vanadium oxide (VO), chromium oxide (CrO), and aluminum nitride (AlN). [B9] The solid-state image-pickup device according to [B8], where the ultraviolet protective film is a laminate of at least two selected from the group consisting of silicon nitride (SiN), silicon oxide (SiO), silicon oxynitride (SiON), aluminum oxide (AlO), titanium oxide (TiO), vanadium oxide (VO), chromium oxide (CrO), and aluminum nitride (AlN). [B10] The solid-state image-pickup device according to [B1], where a stress of the ultraviolet protective film has an absolute value of approximately 500 mPa or less.

[B11] A method of manufacturing a solid-state image-pickup device, the method including: forming at least one or more first photoelectric conversion sections in a substrate; forming an organic photoelectric conversion layer above the substrate; forming an ultraviolet protective film to cover a light incident surface of the organic photoelectric conversion layer; and patterning the organic photoelectric conversion layer to form a second photoelectric conversion section. [B12] The method according to [B11], where the patterning is a dry etch process using plasma irradiation. [B13] The method according to [B12], where during the plasma irradiation, the ultraviolet protective film absorbs approximately 20% or more of the light having a wavelength of approximately 400 nm or less from entering the organic photoelectric conversion layer. [B14] The method according to [B11], where the ultraviolet protective film is formed using a parallel-plate plasma chemical vapor deposition unit having a RF power of approximately 500 W, a substrate temperature of approximately 200 C, a pressure of approximately 5 Torr, a nitrogen flow rate of approximately 5000 sccm, a silane flow rate of approximately 500 sccm, and an ammonia flow rate of approximately 100 sccm. [B15] The method according to [B11], where the organic photoelectric conversion layer is formed between an upper electrode and a lower electrode, and where an end of the organic photoelectric conversion layer, an end of the upper electrode, and an end of the ultraviolet protective film are formed to be within approximately 500 nm from each other. [B16] The method according to [B11], where the organic photoelectric conversion layer has a side surface on the end of the organic photoelectric conversion layer, the upper electrode has a side surface on the end of the upper electrode, and the ultraviolet protective film is in contact with an entire top surface of the organic photoelectric conversion layer and the side surface on the end of the organic photoelectric conversion layer and the side surface on the end of the upper electrode. [B17] The method according to [B11], where the ultraviolet protective film is selected from the group consisting of silicon nitride (SiN), silicon oxide (SiO), silicon oxynitride (SiON), aluminum oxide (A10), titanium oxide (TiO), vanadium oxide (VO), chromium oxide (CrO), and aluminum nitride (AlN). [B18] The method according to [B11], where the ultraviolet protective film is a laminate of at least two selected from the group consisting of silicon nitride (SiN), silicon oxide (SiO), silicon oxynitride (SiON), aluminum oxide (A10), titanium oxide (TiO), vanadium oxide (VO), chromium oxide (CrO), and aluminum nitride (AlN). [B19] The method according to [B11], where the ultraviolet protective film is formed with an opening such that an absolute value of a stress of the ultraviolet protective film is approximately 500 mPa or less.

[B20] An electronic apparatus including: a solid-state image-pickup device including: at least one first photoelectric conversion section disposed in a substrate; a second photoelectric conversion section disposed over the substrate and including an organic photoelectric conversion layer; and an ultraviolet protective film covering a light incident surface of the organic photoelectric conversion layer such that light enters the ultraviolet protective film before the light enters the organic photoelectric conversion layer.

It should be understood by those skilled in the art that various modifications, combinations, sub-combinations, and alterations may occur depending on design requirements and other factors insofar as they are within the scope of the appended claims or the equivalents thereof.

REFERENCE SIGNS LIST image pickup unit
10, 10A, 60 image pickup device
11 semiconductor substrate
11G, 11BA, 11RA organic photoelectric conversion section
11B, 11R inorganic photoelectric conversion section
12 interlayer insulating layer
13a, 13b wiring line
14, 14R, 14B lower electrode
15, 15R, 15B inter-pixel insulating film
16 organic photoelectric conversion layer
16P P-type semiconductor
16N N-type semiconductor
16N co-evaporation layer
17, 17R, 17B upper electrode
18, 18R, 18B ultraviolet absorption film
68 ultraviolet reflective film
19 protective film
20 planarization layer
21 on-chip lens
51 multilayer wiring layer
53 supporting substrate
110 silicon layer
110G, 110G1, 110G2 green storage layer
120a1, 120a2 conductive plug

What is claimed is:

1. A solid-state image-pickup device, comprising:
at least one first photoelectric conversion section disposed in a substrate;
a second photoelectric conversion section disposed over the substrate and including an organic photoelectric conversion layer; and
an ultraviolet protective film that covers a light incident surface of the organic photoelectric conversion layer, wherein a stress of the ultraviolet protective film has an absolute value of approximately 500 mPa or less.

2. The solid-state image-pickup device according to claim 1, wherein light enters the ultraviolet protective film before the light enters the organic photoelectric conversion layer.

3. The solid-state image-pickup device according to claim 1, wherein the second photoelectric conversion section includes an upper electrode between the ultraviolet protective film and the organic photoelectric conversion layer, and a lower electrode between the organic photoelectric conversion layer and the substrate.

4. The solid-state image-pickup device according to claim 1, wherein the light includes light having a wavelength of approximately 400 nm or less, and the ultraviolet protective film absorbs approximately 20% or more of the light having a wavelength of approximately 400 nm or less.

5. The solid-state image-pickup device according to claim 1, wherein the ultraviolet protective film has a thickness of at least approximately 200 nm.

6. The solid-state image-pickup device according to claim 1, wherein the organic photoelectric conversion layer is between an upper electrode and a lower electrode, and wherein an end of the organic photoelectric conversion layer, an end of the upper electrode, and an end of the ultraviolet protective film are vertically aligned approximately 500 nm from each other.

7. The solid-state image-pickup device according to claim 6, wherein the organic photoelectric conversion layer has a side surface on the end of the organic photoelectric conversion layer, the upper electrode has a side surface on the end of the upper electrode, and the ultraviolet protective film is in contact with side surface on the end of the organic photoelectric conversion layer and the side surface on the end of the upper electrode.

8. The solid-state image-pickup device according to claim 1, wherein the ultraviolet protective film is selected from the group consisting of silicon nitride (SiN), silicon oxide (SiO), silicon oxynitride (SiON), aluminum oxide (AlO), titanium oxide (TiO), vanadium oxide (VO), chromium oxide (CrO), and aluminum nitride (AlN).

9. The solid-state image-pickup device according to claim 8, wherein the ultraviolet protective film is a laminate of at least two selected from the group consisting of silicon nitride (SiN), silicon oxide (SiO), silicon oxynitride (SiON), aluminum oxide (AlO), titanium oxide (TiO), vanadium oxide (VO), chromium oxide (CrO), and aluminum nitride (AlN).

10. An electronic apparatus comprising:
a solid-state image-pickup device including:
at least one first photoelectric conversion section disposed in a substrate;
a second photoelectric conversion section disposed over the substrate and including an organic photoelectric conversion layer; and
an ultraviolet protective film covering a light incident surface of the organic photoelectric conversion layer such that light enters the ultraviolet protective film before the light enters the organic photoelectric conversion layer, wherein a stress of the ultraviolet protective film has an absolute value of approximately 500 mPa or less.

* * * * *